(12) United States Patent
Yu et al.

(10) Patent No.: US 10,643,864 B2
(45) Date of Patent: May 5, 2020

(54) FAN-OUT STRUCTURE AND METHOD OF FABRICATING THE SAME

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Chi-Hsi Wu, Hsinchu (TW); Der-Chyang Yeh, Hsinchu (TW); Hsien-Wei Chen, Hsinchu (TW); Wei-Yu Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/416,432

(22) Filed: May 20, 2019

(65) Prior Publication Data
US 2019/0273001 A1 Sep. 5, 2019

Related U.S. Application Data

(63) Continuation of application No. 15/678,788, filed on Aug. 16, 2017, now Pat. No. 10,297,471.
(Continued)

(51) Int. Cl.
*H01L 21/56* (2006.01)
*H01L 25/18* (2006.01)
(Continued)

(52) U.S. Cl.
CPC .......... *H01L 21/568* (2013.01); *H01L 21/561* (2013.01); *H01L 21/6835* (2013.01); *H01L 23/49503* (2013.01); *H01L 23/49816* (2013.01); *H01L 23/49838* (2013.01); *H01L 24/19* (2013.01); *H01L 24/20* (2013.01); *H01L 24/28* (2013.01); *H01L 25/18* (2013.01); *H01L 21/486* (2013.01); *H01L 23/3128* (2013.01); *H01L 23/5383* (2013.01); *H01L 23/5384* (2013.01); *H01L 23/5389* (2013.01); *H01L 25/105* (2013.01); *H01L 2221/68345* (2013.01); *H01L 2221/68359* (2013.01); *H01L 2224/04105* (2013.01); *H01L 2224/12105* (2013.01); *H01L 2224/18* (2013.01);
(Continued)

(58) Field of Classification Search
CPC ............... H01L 23/568; H01L 23/5383; H01L 23/5384; H01L 23/5389; H01L 23/3128; H01L 23/49503; H01L 23/49838; H01L 25/18; H01L 25/105
See application file for complete search history.

(56) References Cited

U.S. PATENT DOCUMENTS 9,524,959 B1 12/2016 Yeh et al.
9,922,964 B1 3/2018 Chen et al.
(Continued)

*Primary Examiner* — Peniel M Gumedzoe
(74) *Attorney, Agent, or Firm* — Slater Matsil, LLP

(57) ABSTRACT

A semiconductor device includes a first die extending through a molding compound layer, a first dummy die having a bottom embedded in the molding compound layer, wherein a height of the first die is greater than a height of the first dummy die, and an interconnect structure over the molding compound layer, wherein a first metal feature of the interconnect structure is electrically connected to the first die and a second metal feature of the interconnect structure is over the first dummy die and extends over a sidewall of the first dummy die.

20 Claims, 38 Drawing Sheets

Related U.S. Application Data

(60) Provisional application No. 62/434,463, filed on Dec. 15, 2016.

(51) Int. Cl.
    *H01L 23/00*     (2006.01)
    *H01L 23/495*     (2006.01)
    *H01L 23/498*     (2006.01)
    *H01L 23/538*     (2006.01)
    *H01L 21/683*     (2006.01)
    *H01L 25/10*     (2006.01)
    *H01L 23/31*     (2006.01)
    *H01L 21/48*     (2006.01)

(52) U.S. Cl.
    CPC ............... *H01L 2224/73267* (2013.01); *H01L 2224/92244* (2013.01); *H01L 2225/1035* (2013.01); *H01L 2225/1058* (2013.01); *H01L 2924/1203* (2013.01); *H01L 2924/1304* (2013.01); *H01L 2924/15311* (2013.01); *H01L 2924/18162* (2013.01); *H01L 2924/3511* (2013.01)

(56) References Cited

U.S. PATENT DOCUMENTS

| | | |
|---|---|---|
| 2013/0119552 A1 | 5/2013 | Lin et al. |
| 2014/0252573 A1 | 9/2014 | Lin et al. |
| 2015/0076713 A1 | 3/2015 | Tsai et al. |
| 2015/0093858 A1 | 4/2015 | Hwang et al. |
| 2016/0118332 A1 | 4/2016 | Lin |
| 2016/0118333 A1 | 4/2016 | Lin |
| 2016/0358865 A1 | 12/2016 | Shih et al. |

FAN-OUT STRUCTURE AND METHOD OF FABRICATING THE SAME

CROSS REFERENCE TO RELATED APPLICATIONS

This application is a continuation of U.S. application Ser. No. 15/678,788, filed Aug. 16, 2017 and entitled "Fan-Out Structure and Method of Fabricating the Same" and is related to, and claims priority to U.S. Provisional Application No. 62/434,463, filed Dec. 15, 2016 and entitled, "Fan-Out Structure and Method of Fabricating the Same", each is herein incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for miniaturization, higher speed and greater bandwidth, as well as lower power consumption and latency has grown recently, there has grown a need for smaller and more creative packaging techniques of semiconductor dies.

As semiconductor technologies further advance, semiconductor devices with a fan-out package have emerged as an effective alternative to further improve the performance of semiconductor devices. In a semiconductor device having a fan-out package, a molding compound layer may be formed around a semiconductor die to provide additional surface area to support the fan-out interconnect structures. For example, a plurality of redistribution layers may be formed over the top surface of the molding compound layer. Furthermore, the redistribution layers are electrically connected to active circuits of the semiconductor die. External input/output pads such as solder balls on under-bump metallization structures may then be formed to electrically connect to the semiconductor die through the redistribution layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
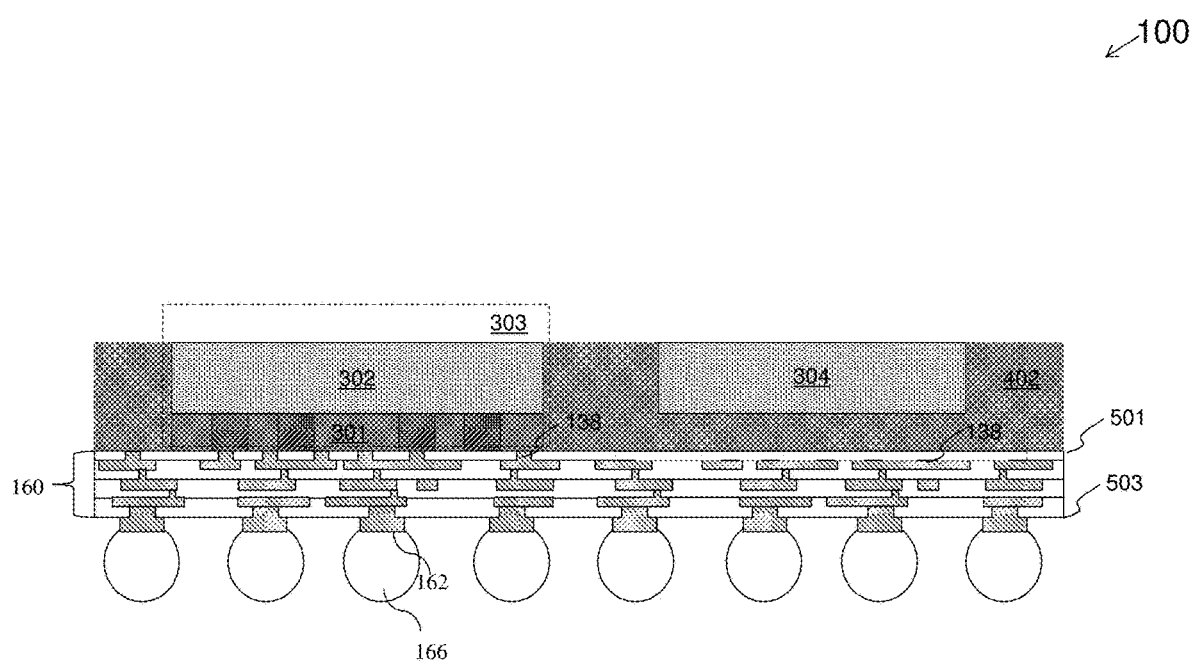
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a fan-out package having a dummy die and a method of forming the same. The embodiments of the disclosure may also be applied, however, to a variety of semiconductor structures. Hereinafter, various embodiments will be explained in detail with reference to the accompanying drawings.

FIG. 1 illustrates a cross sectional view of a semiconductor device in accordance with various embodiments of the present disclosure. The semiconductor device 100 comprises an interconnect structure 160, a molding compound layer 402 on a first side 501 of the interconnect structure 160 and a plurality of bumps 166 formed over a second side 503 of the interconnect structure 160.

A semiconductor die 303 and a dummy die 304 are embedded in the molding compound layer 402. The semiconductor die 303 comprises a substrate portion 302 and an interconnect portion 301. The substrate portion 302 of the semiconductor die 303 may comprise a plurality of active circuits (e.g., a transistor). The interconnect portion 301 of the semiconductor die 303 may comprise a plurality of metal features such as contact pads and the like. The detailed structure of the semiconductor die 303 will be described below with respect to FIG. 3.

In some embodiments, the dummy die 304 is formed of silicon and is free of any active circuits. In some embodiments, the dummy die 304 comprises other suitable materials such as glass, polysilicon and the like.

As shown in FIG. 1, the semiconductor die 303 extends through the molding compound layer 402. The dummy die 304 extends partially through the molding compound layer 402. The top surface of the dummy die 304 is substantially level with the top surfaces of the semiconductor die 303 and the molding compound layer 402. In some embodiments, the top surfaces of the semiconductor die 303 and the dummy die 304 are exposed outside the molding compound layer 402 as shown in FIG. 1.

In some embodiments, there may be metal features 138 formed adjacent to a top surface of the first side 501 of the interconnect structure 160. The interconnect portion 301 of the semiconductor die 303 is in contact with and electrically coupled to corresponding ones of the metal feature 138. More particularly, the input/output terminals such as die connectors or contact pads of the semiconductor die 303 are in direct contact with corresponding metal features 138. The dummy die 304 is not electrically contacting the metal features 138. As shown in FIG. 1, the dummy die 304 and the metal feature 138 are separated by the molding compound layer 402. The detailed processes of forming the metal feature 138 will be described below with respect to FIGS. 6-8.

A plurality of bumps 166 is formed on the second side 503 of the interconnect structure 160. There may be a plurality of under bump metallization (UBM) structures 162 formed underneath the bumps 166. The detailed fabrication processes of the bumps 166 and the UBM structures 162 will be described below with respect to FIGS. 17-18.

It should be noted that the number of semiconductor dies (e.g., semiconductor dies 303) and dummy dies (e.g., dummy die 304) shown in FIG. 1 is merely an example. There may be many variations, modification and alternatives. For example, the semiconductor device 100 may accommodate any number of semiconductor dies and dummy dies.

It should further be noted that the molding compound layer 402 shown in FIG. 1 is merely an example. There may be many variations, modifications and alternatives. For example, the molding compound layer 402 may comprise a plurality of sub-layers and each of the plurality of sub-layers may be formed of a variety of suitable materials. In addition, the height of the molding compound layer 402 may vary depending on a variety of applications and different design needs.

FIGS. 2-19 illustrate intermediate steps of fabricating the semiconductor device shown in FIG. 1 in accordance with various embodiments of the present disclosure. It should be noted that the fabrication steps as well as the package structure shown in FIGS. 2-19 are merely an example. There may be many alternatives, variations and modifications.

Figure 2:
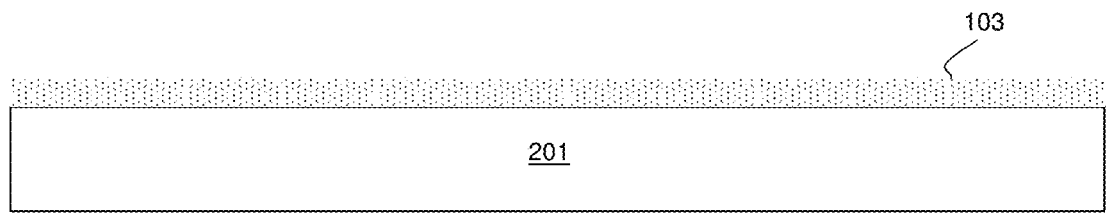
FIGS. 2-19 illustrate intermediate steps of fabricating the semiconductor device shown in FIG. 1 in accordance with various embodiments of the present disclosure.

FIG. 2 illustrates a cross sectional view of a carrier having a release layer 103 in accordance with various embodiments of the present disclosure. As shown in FIG. 2, the release layer 103 is formed on a carrier 201. The carrier 201 may be formed of silicon, glass, ceramic aluminum oxide, silicon oxide, a combination thereof, and/or the like. In some embodiments, the release layer 103 is formed of an epoxy-based thermal-release material. In some embodiments, the release layer 103 may be formed of an ultra-violet (UV) glue, which loses its adhesive property when exposed to UV lights.

The release layer 103 may be formed over the carrier 201 by any suitable semiconductor fabrication techniques. In some embodiments, the release layer 103 may be dispensed as a liquid and subsequently cured. In some embodiments, release layer 103 may be laminated onto the carrier 201.

Figure 3:
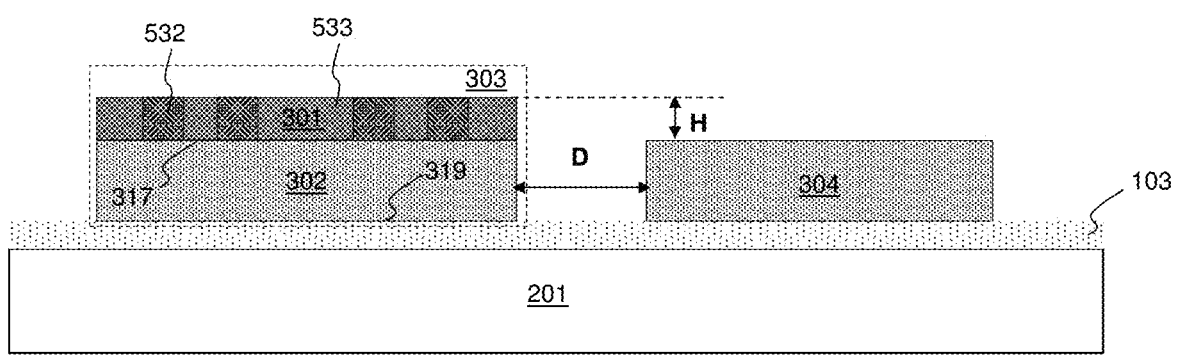

FIG. 3 illustrates a cross sectional view of the device shown in FIG. 2 after a semiconductor die 303 and a dummy die 304 are mounted on the carrier in accordance with various embodiments of the present disclosure. The semiconductor die 303 and the dummy die 304 are picked and placed on the carrier 201 as shown in FIG. 3.

The semiconductor die 303 and the dummy die 304 may be secured to the carrier 201 through an adhesive layer (not shown). The adhesive layer is on back-sides of the semiconductor die 303 and the dummy die 304. The adhesive layer may be any suitable adhesive, epoxy, die attach film (DAF), and/or the like.

The semiconductor die 303 comprises a substrate portion 302 and an interconnect portion 301. The interconnect portion 301 is over and in contact with a first side 317 of the substrate portion 302. A second side 319 of the substrate portion 302 is in contact with the release layer 103. Throughout the description, the first side 317 the substrate portion 302 is alternatively referred to as a front side of the substrate portion 302. The second side 319 the substrate portion 302 is alternatively referred to as a backside of the substrate portion 302.

In some embodiments, the interconnect portion 301 of the semiconductor die 303 comprises a plurality of contact pads 532. It should be noted while FIG. 3 illustrates four contact pads (e.g., contact pad 532) are in the interconnect portion 301, other suitable interconnect elements such as vias, metal lines, redistribution lines and the like may be formed in the interconnect portion 301 depending on different design needs and applications.

The contact pads 532 may be formed by, for example, plating, or the like. The contact pads 532 electrically couple the respective integrated circuits of the semiconductor die 303. An insulating material 533 is on the active sides of the semiconductor die 303. The insulating material 533 laterally encapsulates the contact pads 532.

The insulating material 533 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, chemical vapor deposition (CVD), or the like.

As shown in FIG. 3, there is a thickness difference between the semiconductor die 303 and the dummy die 304. The thickness difference is defined as H. In some embodiments, H is greater than 10 um, such as between about 10 um to about 20 um. The thickness of the dummy die is greater than 40 um, such as between about 40 um to about 50 um. Furthermore, in some embodiments, the thickness of the dummy die 304 is substantially equal to the thickness of the substrate portion 302 of the semiconductor die 303 as shown in FIG. 3.

As shown in FIG. 3, there is a gap between the semiconductor die 303 and the dummy die 304. The distance between the semiconductor die 303 and the dummy die 304 is defined as D. In some embodiments, D is greater than a predetermined value. Depending on design needs, the predetermined value is in range from about 90 um to about 100 um, or greater.

Figure 4:
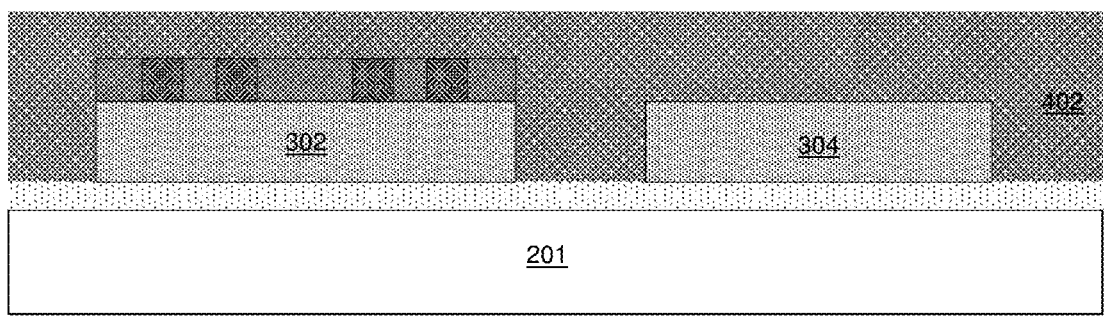

FIG. 4 illustrates a cross sectional view of the semiconductor device shown in FIG. 3 after a molding compound layer 402 is formed over the carrier 201 in accordance with various embodiments of the present disclosure. After the molding compound layer 402 is formed over the carrier 201, the semiconductor die 303 and the dummy die 304 are embedded in the molding compound layer 402 as shown in FIG. 4.

In some embodiments, the molding compound layer 402 may be an epoxy, which is dispensed at the gaps described above. The epoxy may be applied in a liquid form, and may harden after a curing process. In some embodiments, the molding compound layer 402 may be formed of curable materials such as polymer based materials, resin based materials, polyimide, epoxy and any combinations of thereof. The molding compound layer 402 can be formed by any suitable dispense techniques.

When the molding compound layer 402 is formed by applying the epoxy in a liquid form and hardening it to form the molding compound layer 402 after a curing process, the distance D (e.g., about 100 um) between the semiconductor die 303 and the dummy die 304 allows the epoxy to fully penetrate and fill the gap between the semiconductor die 303 and the dummy die 304.

Figure 5:
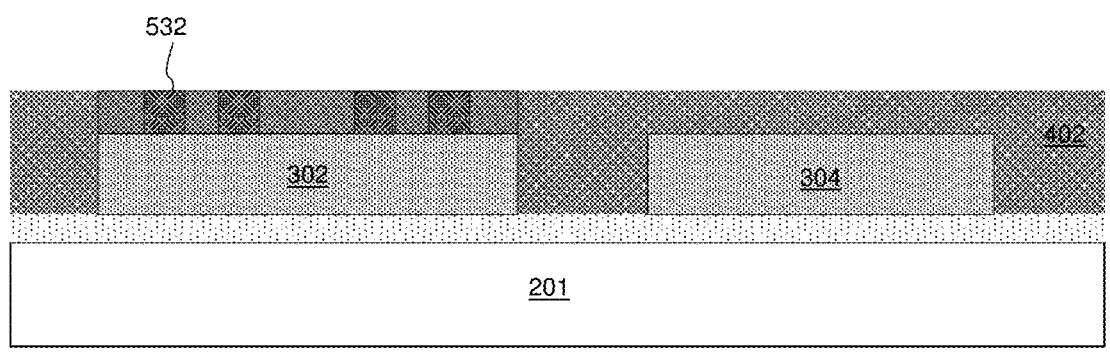

FIG. 5 illustrates a cross sectional view of the semiconductor device shown in FIG. 4 after a thinning process is applied to the top surface of the molding compound layer in accordance with various embodiments of the present disclosure. The thinning process can employ a mechanical grinding process, a chemical polishing process, an etching process, any combinations thereof and/or the like.

As shown in FIG. 5, the grinding process is applied to the top surface of the molding compound layer 402 until the top surfaces of the interconnect portion of the semiconductor die becomes exposed. In particular, as shown in FIG. 5, the top surfaces of the semiconductor die 303 may be exposed. As a result of performing the thinning process, the top surfaces of the contact pads 532 are substantially level, within process variations, with the top surface of the molding compound layer 402.

Through FIGS. 6-17, an interconnect structure 160 (see FIG. 1) is formed. As will be illustrated in FIG. 17, the interconnect structure 160 includes insulating layers 132, 140, 148, and 156 and metallization patterns 138, 146, and 154.

Figure 6:
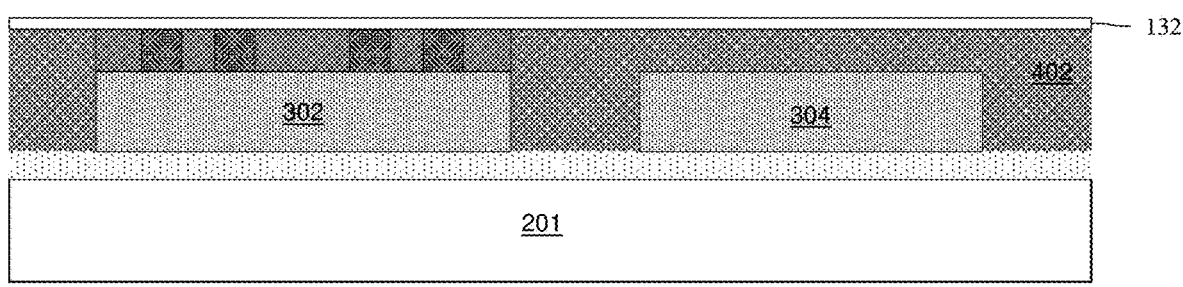

Referring first to FIG. 6, there is shown a cross sectional view of the semiconductor device shown in FIG. 5 after an insulating layer 132 is formed over the top surface of the molding compound layer 402 in accordance with various embodiments of the present disclosure. The insulating layer 132 is deposited on the molding compound layer 402. In some embodiments, the insulating layer 132 is formed of a polymer, which may be a photo-sensitive material such as PBO, polyimide, BCB, or the like, that may be patterned using a lithography mask. In other embodiments, the insulating layer 132 is formed of a nitride such as silicon nitride; an oxide such as silicon oxide, PSG, BSG, BPSG; or the like. The insulating layer 132 may be formed by spin coating, lamination, CVD, the like, or a combination thereof. In some embodiments, the insulating layer 132 is formed of a dielectric material.

Figure 7:
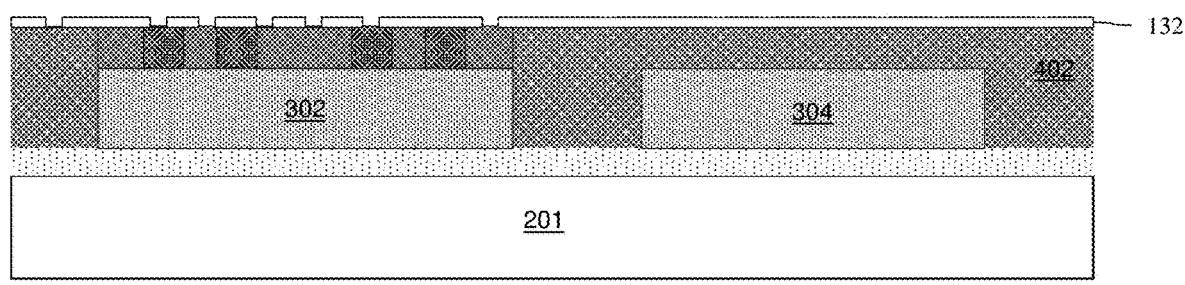

FIG. 7 illustrates a cross sectional view of the semiconductor device shown in FIG. 6 after a patterning process has been applied to the insulating layer 132 in accordance with various embodiments of the present disclosure. The insulating layer 132 is then patterned. The patterning process may be an acceptable process, such as by exposing the insulating layer 132 to light when the insulating layer 132 is a photo-sensitive material or by etching using, for example, an anisotropic etching process. If the insulating layer 132 is a photo-sensitive material, the insulating layer 132 can be developed after the exposure.

Figure 8:
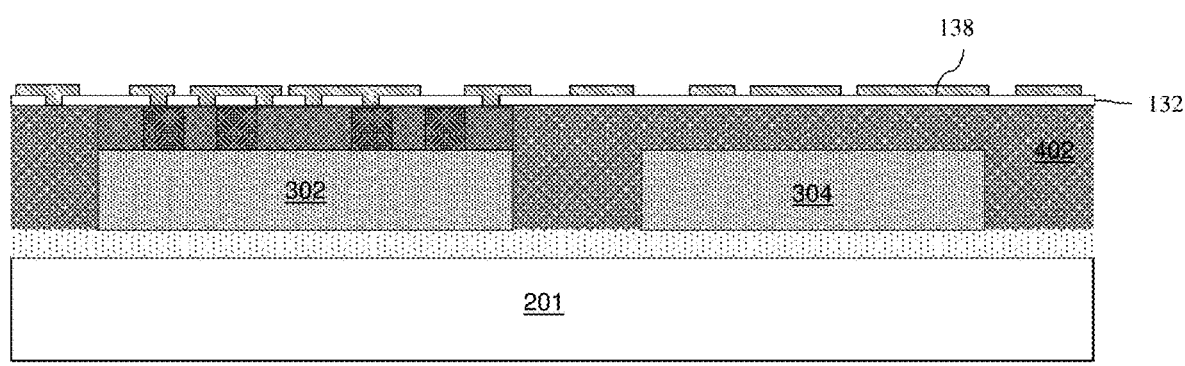
Figure 9:
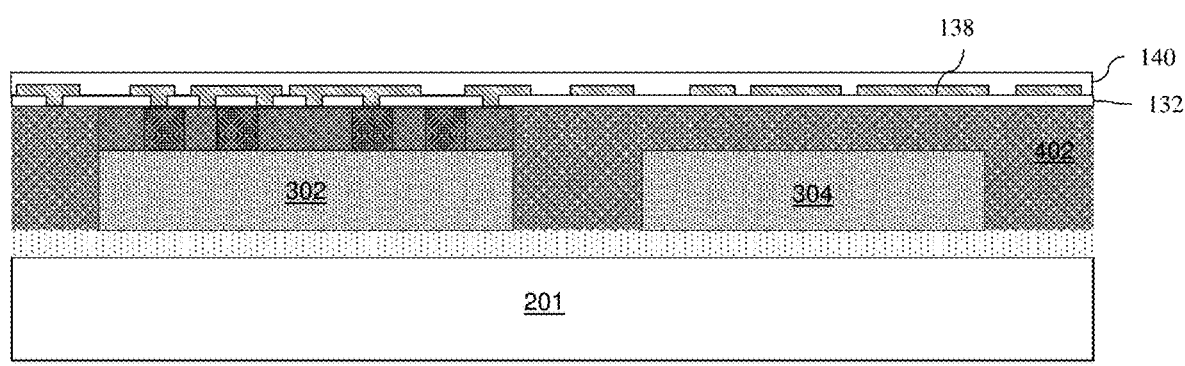
Figure 10:
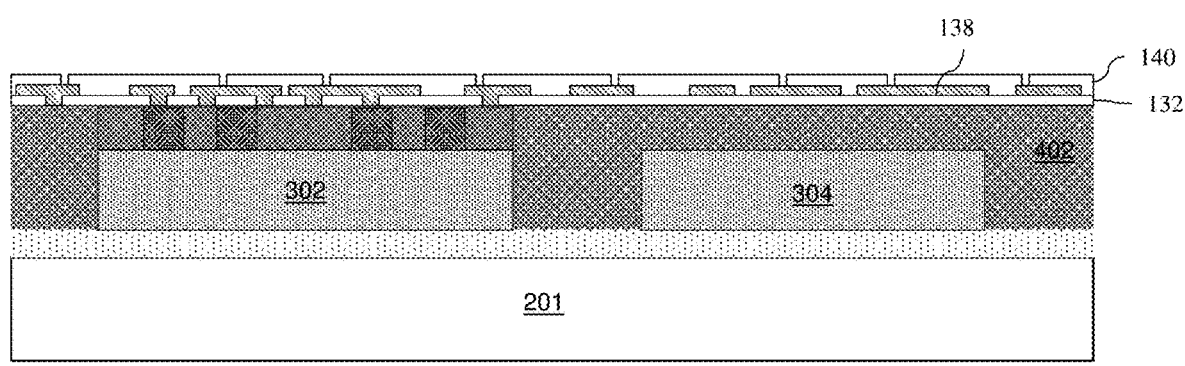
Figure 11:
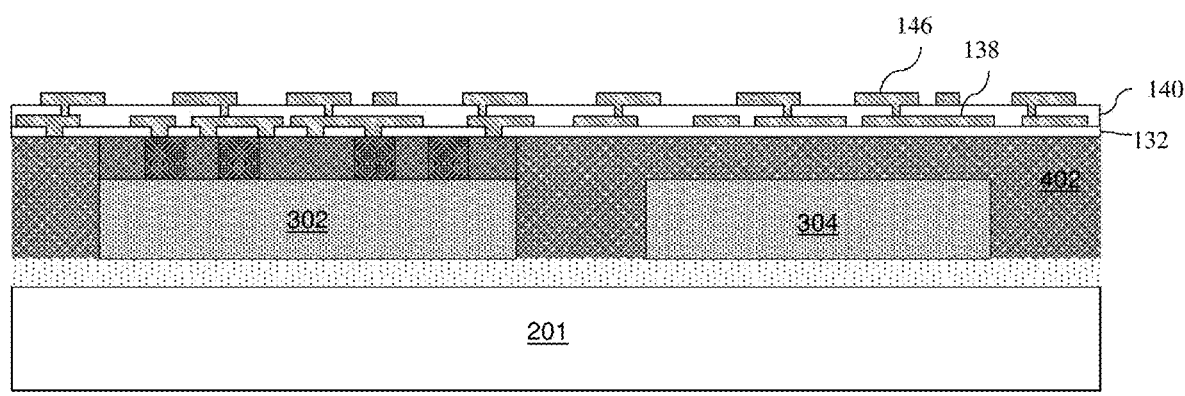
Figure 12:
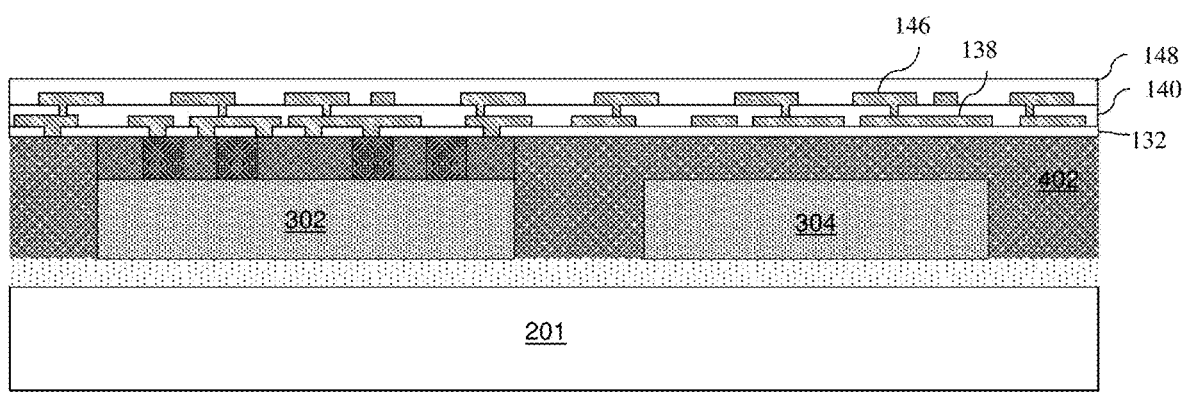
Figure 13:
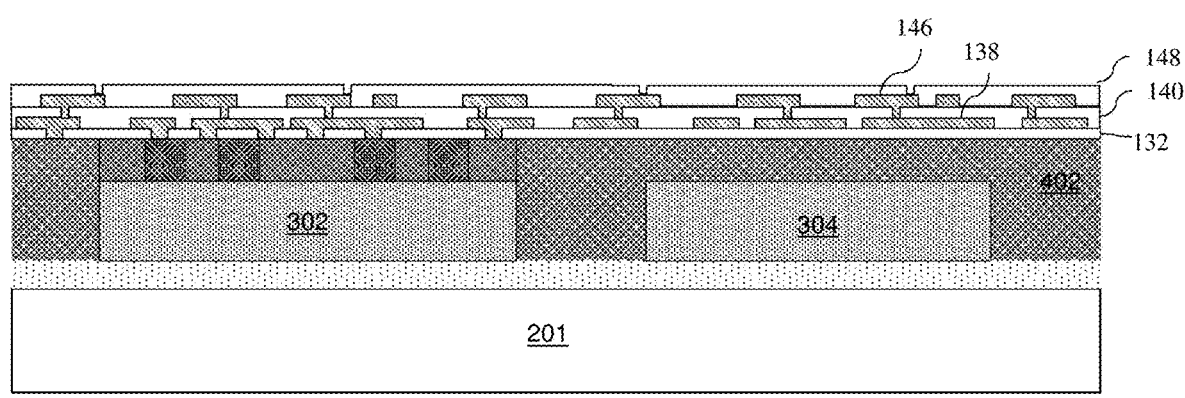
Figure 14:
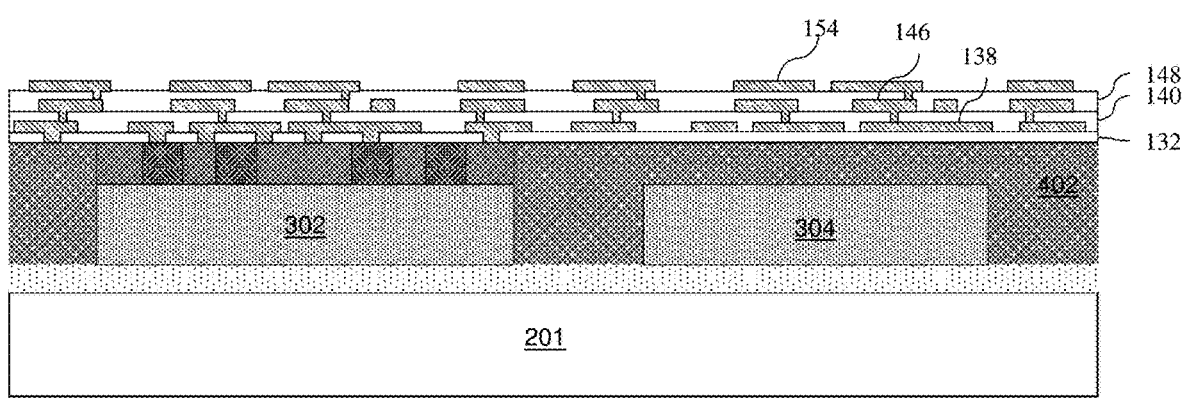

FIG. 8 illustrates a cross sectional view of the semiconductor device shown in FIG. 7 after a metallization pattern 138 is formed on the insulating layer 132 in accordance with various embodiments of the present disclosure. As an example to form metallization pattern 138, a seed layer (not shown) is formed over the insulating layer 132 and in openings through the insulating layer 132. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, plasma vapor deposition (PVD) or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings in the insulating layer 132. Throughout the description, the metallization pattern 138 may be alternatively referred to as the metal feature 138.

The processes described above with reference to FIGS. 6-8 may be repeated multiple times to form multiple layers of metallization patterns. For example, FIGS. 9-16 illustrate various intermediate stages of forming subsequent insulating layers 140, 148, and 156 and metallization patterns 146, and 154. The materials and processes of forming the subsequent insulating layers 140, 148, and 156 may be performed in a similar manner as described for the insulating layer 132, and the materials and processes of forming the subsequent metallization patterns 146, and 154 may be performed in a similar manner as described for the metallization pattern 138.

It should be noted that the interconnect structure 160 is shown as an example. More or fewer dielectric layers and metallization patterns may be formed in the interconnect structure 160. If fewer dielectric layers and metallization patterns are to be formed, steps and process discussed above may be omitted. If more dielectric layers and metallization patterns are to be formed, steps and processes discussed above may be repeated. One having ordinary skill in the art would understand which steps and processes would be omitted or repeated.

Figure 16:
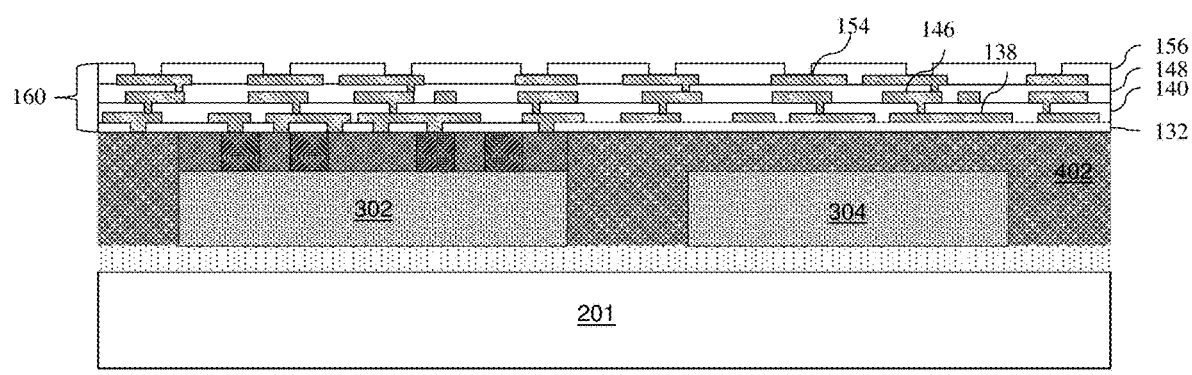
Figure 17:
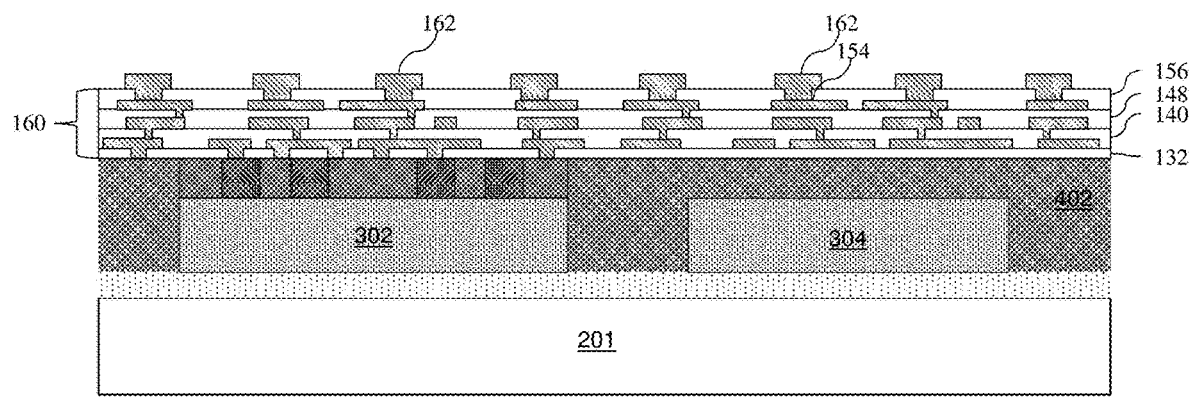

FIG. 17 illustrates a cross sectional view of the semiconductor device shown in FIG. 16 after pads 162 have been formed on the interconnect structure 160 in accordance with various embodiments of the present disclosure. In FIG. 17, pads 162 are formed on an exterior side of the interconnect structure 160. The pads 162 are used to couple to conductive connectors 166 (see FIG. 18) and may be referred to as UBMs 162. In the illustrated embodiment, the pads 162 are formed through openings in the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162.

Figure 18:
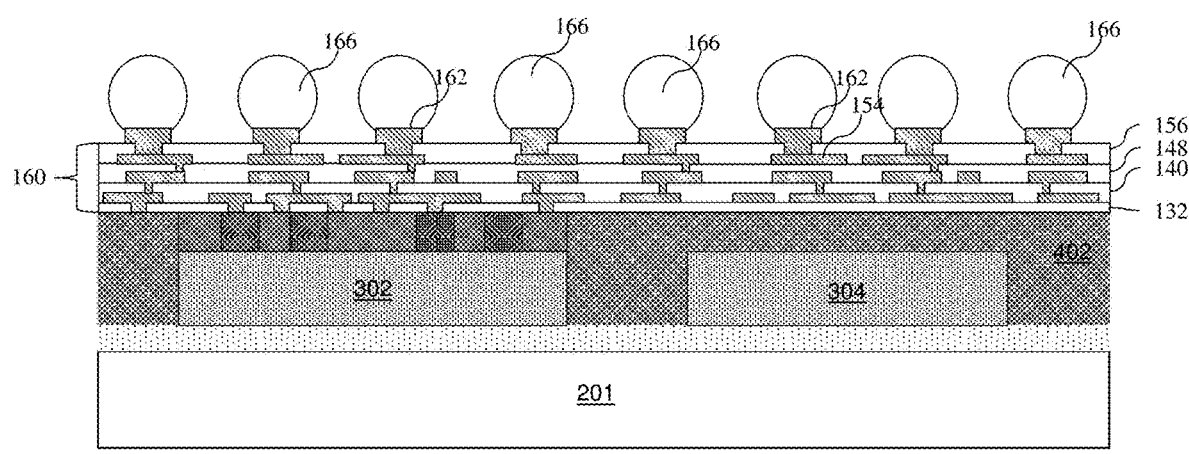

FIG. 18 illustrates a cross sectional view of the semiconductor device shown in FIG. 17 after conductive connectors 166 have been formed on the pads 162 in accordance with various embodiments of the present disclosure. In FIG. 18, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process. Throughout the description, the conductive connectors 166 may be alternatively referred to as bumps 166.

Figure 19:
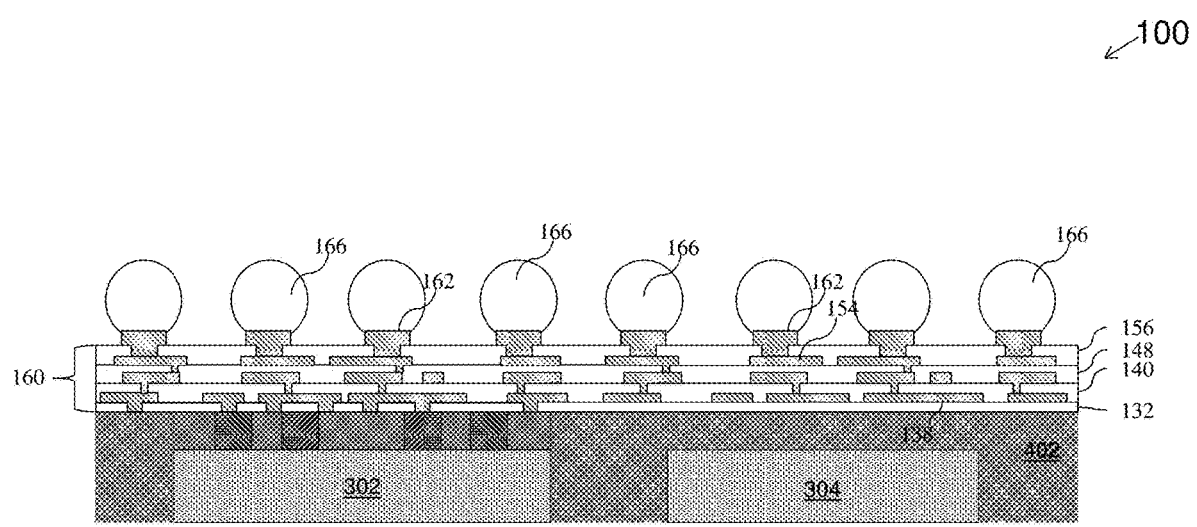

FIG. 19 illustrates a cross sectional view of the semiconductor device shown in FIG. 18 after the carrier 201 has been removed from the semiconductor device in accordance with various embodiments of the present disclosure. A variety of detaching processes may be employed to separate the semiconductor device 100 from the carrier 201. The variety of detaching processes may comprise a chemical solvent, a UV exposure and the like. The remaining release layer 103 may be removed from the semiconductor device 100 by using a suitable etching process.

One advantageous feature of having the semiconductor die and dummy die configuration shown in FIG. 19 is that the dummy die may help to improve the fan-out ratio (ratio of die area to package area) of the semiconductor device 100, thereby reducing wafer warpage. For example, in the embodiment illustrated in FIG. 19, a die area includes the area of the semiconductor die 303 and the area of the dummy die 304. As such, the ratio of the die area (e.g., the area of the semiconductor die 303 and the area of the dummy die 304) to the package area (e.g., the area of the semiconductor die 303, the area of the dummy die 304 and the area of the molding compound layer 402 along the bottom surface) increases. Furthermore, the gap between the dummy die 304 and the metallization pattern 138 helps to improve the routing flexibility of the interconnect structure 160. In particular, the dummy die 304 is not contacting the metallization pattern 138 as shown in FIG. 19. The molding compound layer 402 between the dummy die 304 and the metallization pattern 138 functions as a buffer. Such a buffer reduces the stresses induced by the dummy die 304, thereby reducing the design keep-out zone around the dummy die 304. Such a reduced keep-out zone helps to improve the routing flexibility of the interconnect structure 160.

Figure 20:
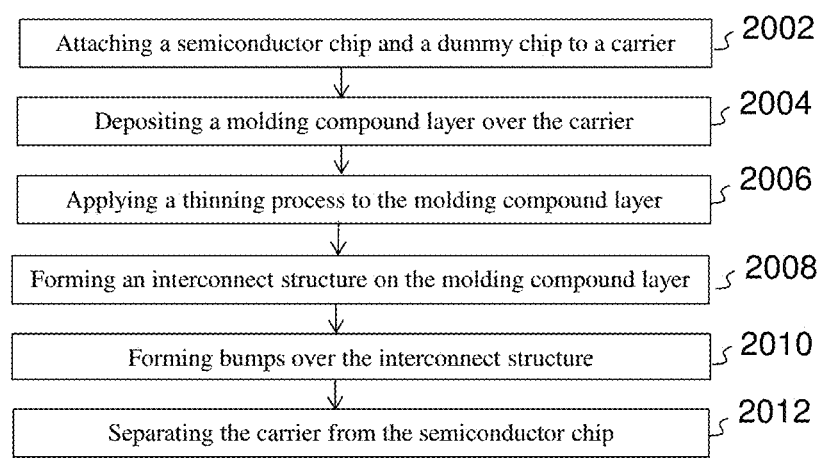
FIG. 20 illustrates a flow chart of a method for forming the semiconductor device shown in FIG. 1 in accordance with various embodiments of the present disclosure.

FIG. 20 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various steps as illustrated in FIG. 20 may be added, removed, replaced, rearranged and repeated.

At step 2002, a semiconductor die and a dummy die are attached to a carrier through a release layer, such as illustrated in FIGS. 2-3. The thickness of the semiconductor die is greater than the thickness of the dummy die. The semiconductor die comprises a substrate portion and an interconnect portion. The backside of the substrate portion is in contact with the release layer.

At step 2004, a molding compound layer is formed over the carrier, such as illustrated in FIG. 4. The semiconductor die and the dummy die are embedded in the molding compound layer. At step 2006, a thinning process is applied to the molding compound layer until the top surface of the semiconductor die is exposed, such as illustrated in FIG. 5.

After the grinding process finishes, there is a gap between the top surface of the dummy die and the top surface of the molding compound layer.

At step 2008, an interconnect structure including a plurality of metallization patterns is formed over the molding compound layer, such as illustrated in FIGS. 6-16. At step 2010, a plurality of pads (e.g., UBM structures) are formed over the interconnect structure, such as illustrated in FIG. 17. A plurality of bumps is formed over their respective UBM structures, such as illustrated in FIG. 18. At step 2012, a suitable carrier removal technique is employed to separate the carrier from the semiconductor device, such as illustrated in FIG. 19.

Figure 21:
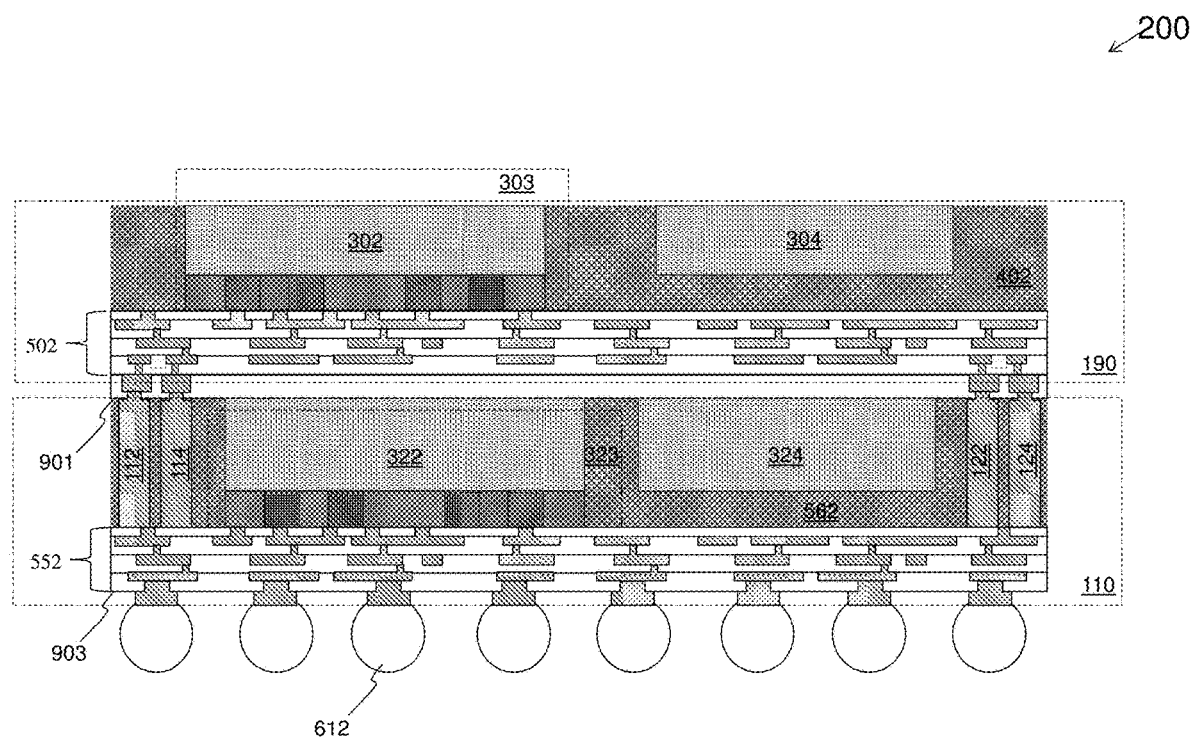
FIG. 21 illustrates a cross sectional view of a stacked-die semiconductor device in accordance with various embodiments of the present disclosure.

FIGS. 21-29 illustrate the dummy die can be employed in other semiconductor packages in accordance with some embodiments. FIG. 21 illustrates a stacked-die semiconductor device having a first dummy die 304 and a second dummy die 324. FIGS. 22-29 illustrate the intermediate steps of fabricating the stacked-die semiconductor device shown in FIG. 21. FIGS. 21-29 illustrate processes and structures similar to those discussed above with reference to FIGS. 1-19, wherein like reference numerals refer to like elements, and descriptions on the like elements are not repeated.

FIG. 21 illustrates a cross sectional view of a stacked-die semiconductor device in accordance with various embodiments of the present disclosure. The stacked-die semiconductor device 200 includes a bottom package 110 and a top package 190. In particular, the top package 190 is stacked on a first side 901 of the bottom package 110. A plurality of bumps 612 are formed on a second side 903 of the bottom package 110 as shown in FIG. 21.

The top package 190 comprises a first semiconductor die 303 and a first dummy die 304. The first semiconductor die 303 and the first dummy die 304 are similar to the semiconductor die 303 and dummy die 304, respectively shown in FIG. 1, and hence are not discussed in further detail herein.

The first semiconductor die 303 and the first dummy die 304 are embedded in a first molding compound layer 402. A first interconnect structure 502 extends along a first surface of the first molding compound layer 402. The first interconnect structure 502 is similar to the interconnect structure 160 shown in FIG. 1, and hence is not discussed again to avoid repetition. As shown in FIG. 21, the first dummy die 304 and the first interconnect structure 502 are separated by the first molding compound layer 402. The first dummy die 304 is not in contact with the metallization patterns of the first interconnect structure 502.

The bottom package 110 comprises a second semiconductor die 323 and a second dummy die 324. The second semiconductor die 323 and the second dummy die 324 are similar to the semiconductor die 303 and dummy die 304, respectively shown in FIG. 1, and hence are not discussed in further detail herein to avoid repetition.

The second semiconductor die 323 and the second dummy die 324 are embedded in a second molding compound layer 562. The second molding compound layer 562 is formed over a second interconnect structure 552. The second interconnect structure 552 is similar to the interconnect structure 160 shown in FIG. 1, and hence are not discussed in further detail herein.

The second molding compound layer 562 further comprises a plurality of through vias, namely through vias 111, 114, 122 and 124. As shown in FIG. 21, a first through via 112 and a second through via 114 are adjacent to the second semiconductor die 323. A third through via 122 and a fourth through via 124 are adjacent to the second dummy die 324. The through vias 112, 114, 122 and 124 extend through the second molding compound layer 562.

As shown in FIG. 21, the second dummy die 324 and the second interconnect structure 552 are separated by the second molding compound layer 562. The second dummy die 324 is not in contact with the metallization patterns of the second interconnect structure 552.

One advantageous feature of the stacked-die semiconductor device 200 shown in FIG. 21 is that the dummy dies 304 and 324 help to improve the fan-out ratio, thereby reducing fan-out package warpage. Furthermore, the gaps between the dummy dies (e.g., dummy die 304) and their respective interconnect structures (e.g., interconnect structure 502) help to improve the routing flexibility of the interconnect structures 502 and 552. In particular, the dummy dies 304 and 324 are not contacting their respective interconnect structures as shown in FIG. 21. The molding compound layers 402 and 562 function as buffers to reduce the stresses induced by the dummy dies 304 and 324, respectively, thereby reducing the keep-out zones around the dummy dies 304 and 324. The reduced keep-out zones help to improve the routing flexibility of the interconnect structures 502 and 552.

FIGS. 22-29 illustrate intermediate steps of fabricating the stacked-die semiconductor device shown in FIG. 21 in accordance with various embodiments of the present disclosure. It should be noted that the fabrication steps as well as the stacked-die semiconductor device shown in FIGS. 22-29 are merely an example. A person skilled in the art will recognize there may be many alternatives, variations and modifications.

Figure 15:
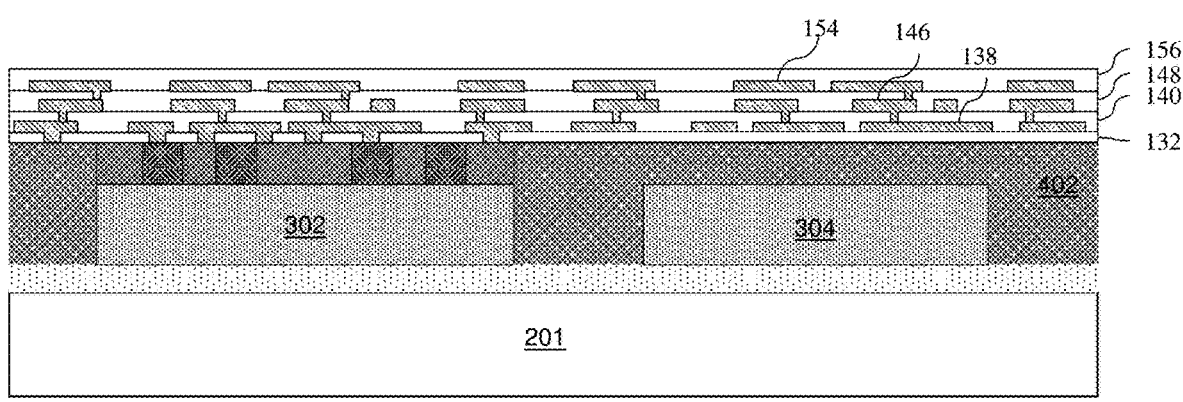
Figure 22:
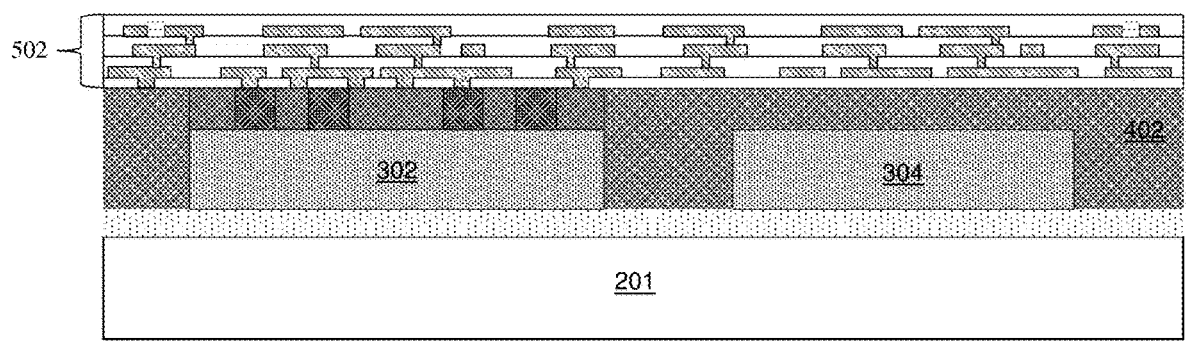
FIGS. 22-29 illustrate intermediate steps of fabricating the stacked-die semiconductor device shown in FIG. 21 in accordance with various embodiments of the present disclosure.

FIG. 22 illustrates a semiconductor device similar to the semiconductor device shown in FIG. 15. Hence, the process of forming the semiconductor device shown in FIG. 22 is not discussed in detail herein again.

Figure 23:
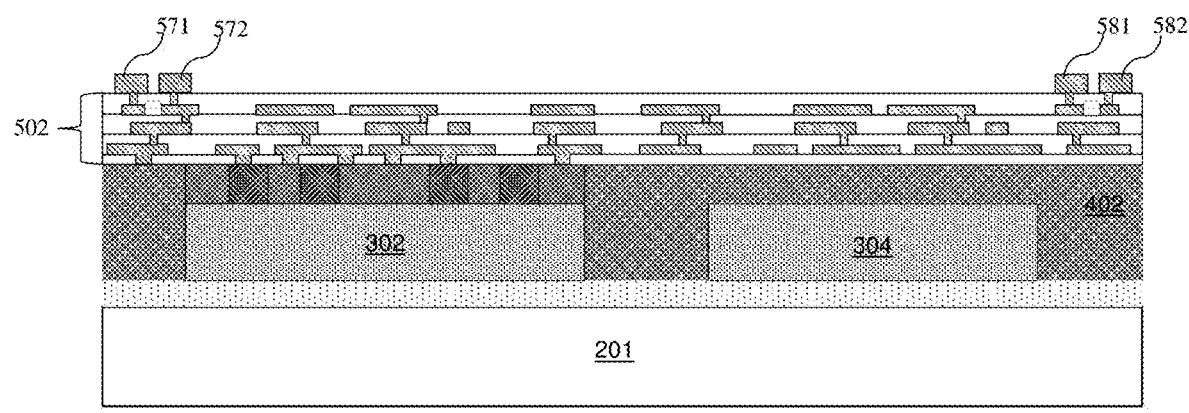

FIG. 23 illustrates a cross sectional view of the semiconductor device shown in FIG. 22 after pads 571, 572, 581 and 582 have been formed over the interconnect structure 502 in accordance with various embodiments of the present disclosure. As an example to form the pads 571, 572, 581 and 582, a seed layer (not shown) is formed over the interconnect structure 502 after the uppermost insulating layer has been patterned. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 571, 572, 581 and 582. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 571, 572, 581 and 582.

Figure 24:
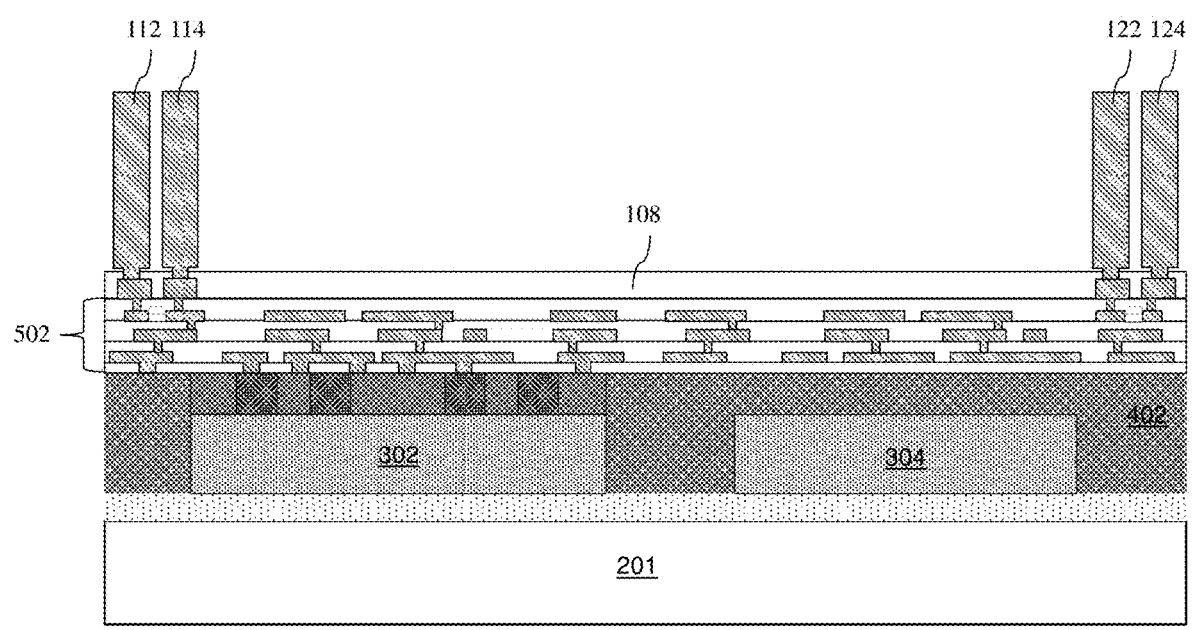

FIG. 24 illustrates a cross sectional view of the semiconductor device shown in FIG. 23 after a plurality of through vias 112, 114, 122 and 124 has been formed over the interconnect structure 502 in accordance with various embodiments of the present disclosure. In FIG. 24, an insulating layer 108 is formed on the interconnect structure 502. In some embodiments, the insulating layer 108 is formed of a polymer, which may be a photo-sensitive material such as PBO, polyimide, BCB, or the like, that may be patterned using a lithography mask. In other embodiments, the insulating layer 108 is formed of a nitride such as silicon nitride; an oxide such as silicon oxide, PSG, BSG, BPSG; or the like. The insulating layer 108 may be formed by spin coating, lamination, CVD, the like, or a combination thereof. The insulating layer 108 is then patterned to form openings to expose portions of the pads 571, 572, 581 and 582. The patterning may be by an acceptable process, such as by exposing the insulating layer 108 to light when the dielectric layer is a photo-sensitive material or by etching using, for example, an anisotropic etching process.

Further in FIG. 24, through vias 112, 114, 122 and 124 are formed. As an example to form the through vias 112, 114, 122 and 124, a seed layer is formed over the insulating layer 108 and the exposed portions of the pads 571, 572, 581 and 582. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112, 114, 122 and 124.

Figure 25:
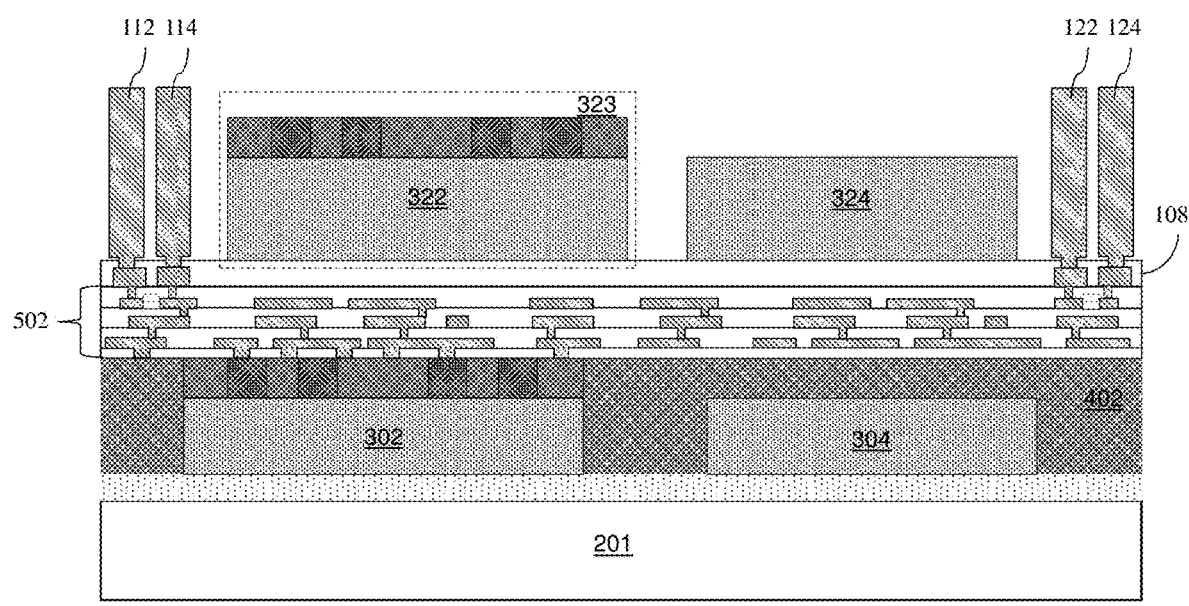

FIG. 25 illustrates a cross sectional view of the semiconductor device shown in FIG. 24 after a second semiconductor die 232 and a second dummy die 324 are mounted over the first interconnect structure 502 in accordance with various embodiments of the present disclosure. The second semiconductor die 323 and the second dummy die 324 are similar to the semiconductor die 303 and dummy die 304 shown in FIG. 1, and hence are not discussed herein.

The second semiconductor die 323 and the second dummy die 324 are picked and placed on the insulating layer 108 as shown in FIG. 25. In some embodiments, the substrate sides of the second semiconductor die 323 and the second dummy die 324 are bonded on the insulating layer 108 through an adhesive layer (not shown). In some embodiments, the substrate side of the second semiconductor die 323 is in direct contact with the top surface of the insulating layer 108.

It should be noted that while FIG. 25 illustrates two semiconductor dies 323 and 324 bonded on the insulating layer 108, the insulating layer 108 may accommodate more semiconductor dies depending on different applications and design needs.

It should further be noted that FIG. 25 illustrates the top surface of the semiconductor die 323 is lower than the top surfaces of the vias (e.g., through via 112). The thickness of the semiconductor die 323 illustrated in FIG. 25 is merely an example, which should not unduly limit the scope of the claims. One of ordinary skill in the art would recognize many variations, alternatives, and modifications. For example, the top surfaces of the vias (e.g., through via 112) may be substantially level with the top surface of the second semiconductor die 323.

Figure 26:
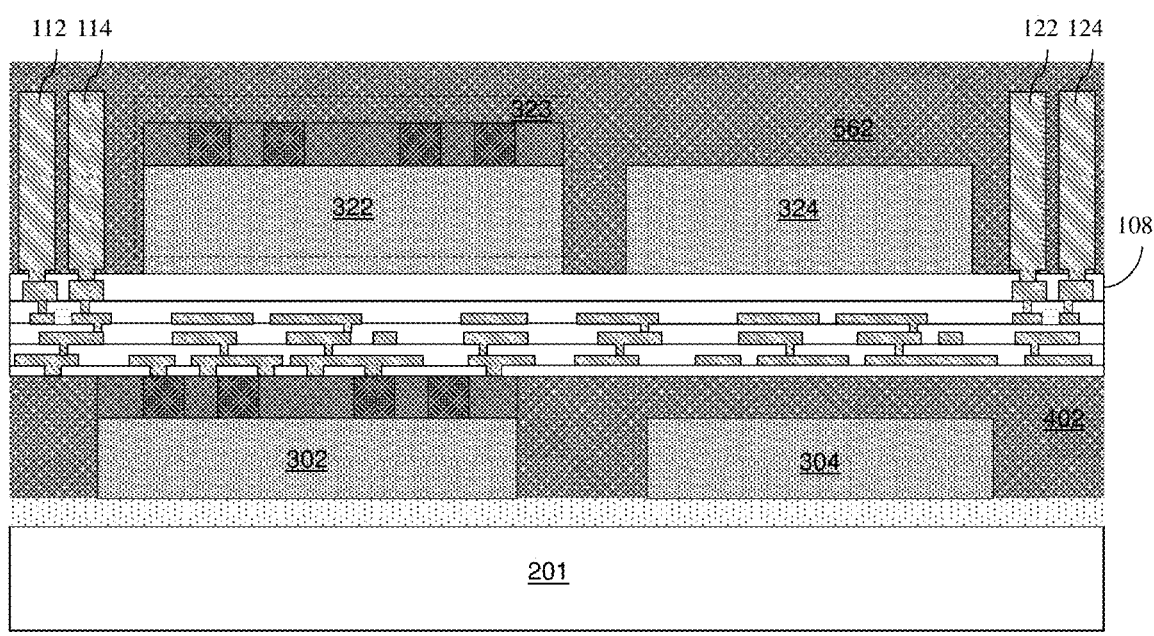

FIG. 26 illustrates a cross sectional view of the semiconductor device shown in FIG. 25 after a second molding compound layer 562 is formed over the first molding compound layer 402 in accordance with various embodiments of the present disclosure. The second molding compound layer 562 may fill the gaps between the semiconductor dies and the adjacent through vias (e.g., the gap between through via 124 and semiconductor die 323) as well as the gap between two adjacent vias (e.g., the gap between through vias 122 and 124). As shown in FIG. 26, the through vias 112, 114, 122 and 124, and the semiconductor die 323 and dummy die 324 are embedded in the second molding compound layer 562.

In some embodiments, the second molding compound layer 562 may be an epoxy, which is dispensed at the gaps described above. The epoxy may be applied in a liquid form, and may harden after a curing process. In some embodiments, the second molding compound layer 562 may be formed of curable materials such as polymer based materials, resin based materials, polyimide, epoxy and any combinations of thereof. The second molding compound layer 562 can be formed by any suitable dispense techniques.

Figure 27:
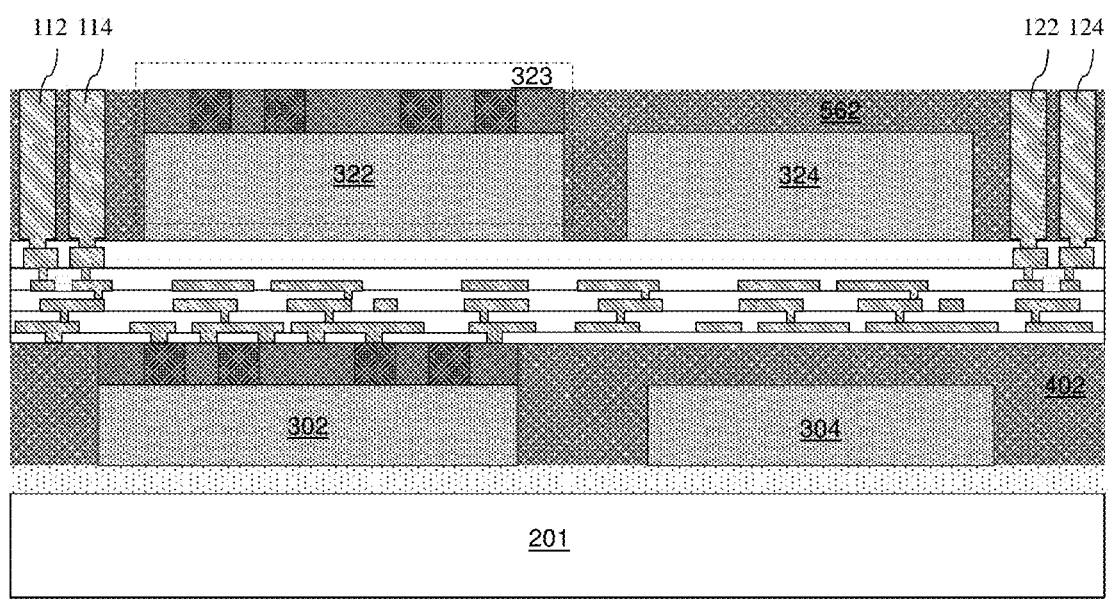

FIG. 27 illustrates a cross sectional view of the semiconductor device shown in FIG. 26 after a thinning process is applied to the top surface of the second molding compound layer 562 in accordance with various embodiments of the present disclosure. The thinning process can employ a mechanical grinding process, a chemical polishing process, an etching process, any combinations thereof and/or the like.

As shown in FIG. 27, the thinning process is applied to the top surface of the second molding compound layer 562 until the top surface of the second semiconductor die 323 becomes exposed. In particular, as shown in FIG. 27, the top surface of the interconnect side of the second semiconductor die 323 may be exposed through the second molding compound layer 562. As a result of performing the grinding process, the top surfaces of the through vias 112, 114, 122 and 124 are substantially level with the top surface of the second semiconductor die 323.

Figure 28:
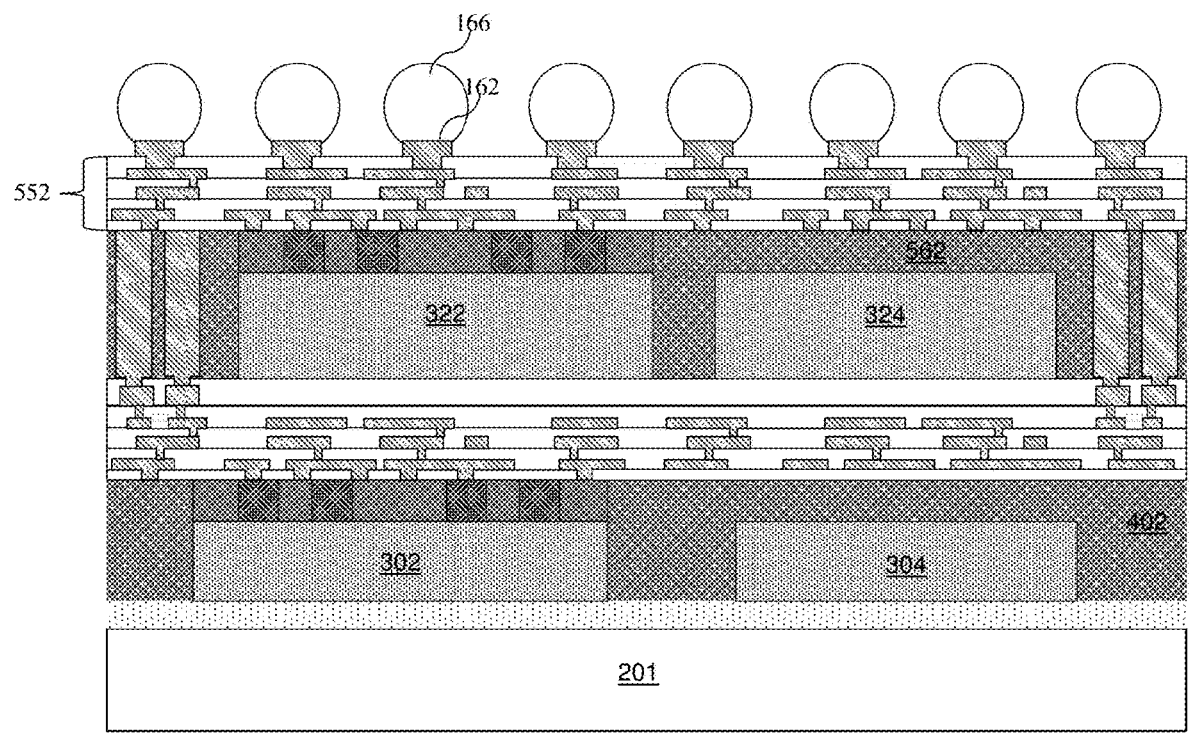
Figure 29:
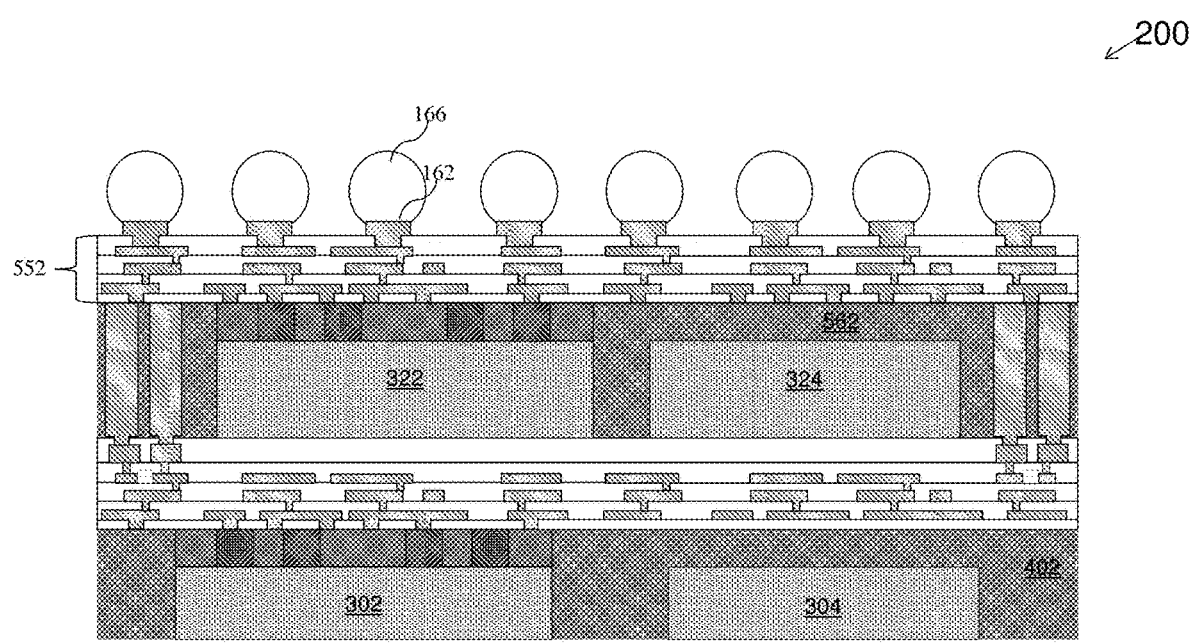

The steps shown in FIGS. 28-29 are similar to those shown in FIGS. 5-19, and hence are not discussed in detail herein to avoid repetition.

Figure 30:
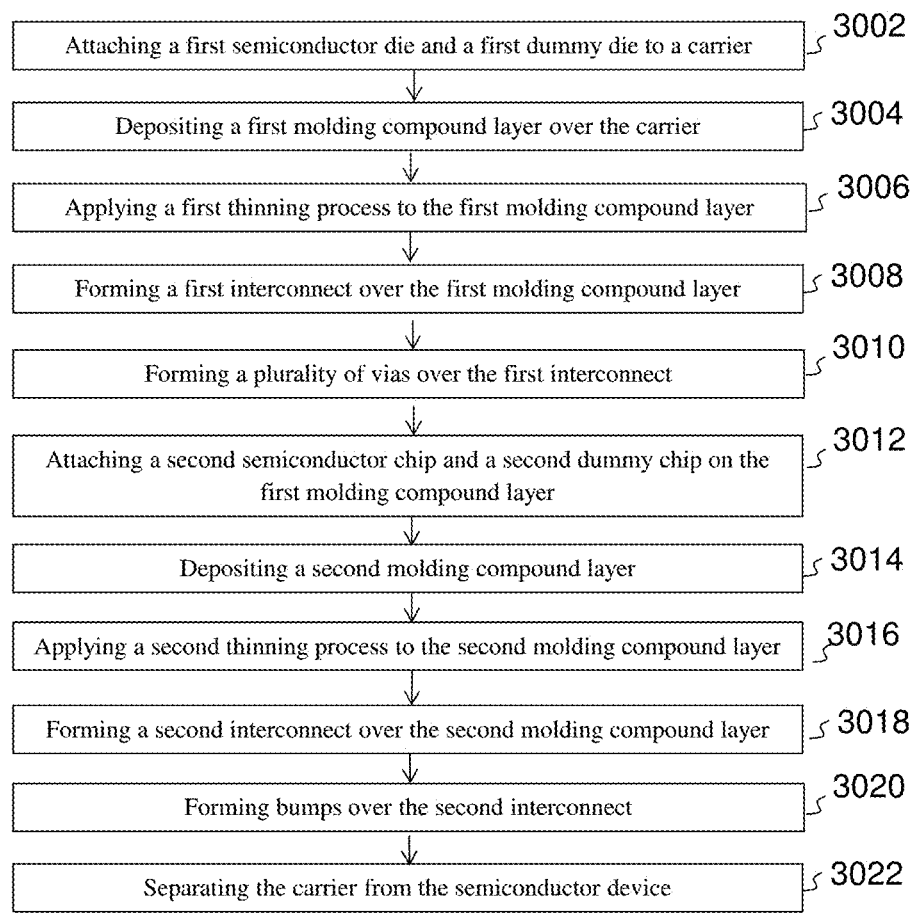
FIG. 30 illustrates a flow chart of a method for forming the semiconductor device shown in FIG. 21 in accordance with various embodiments of the present disclosure.

FIG. 30 illustrates a flow chart of a method for forming the semiconductor device shown in FIG. 21 in accordance with various embodiments of the present disclosure. This flowchart is merely an example, which should not unduly limit the scope of the claims. Many variations, alternatives, and modifications are possible. For example, various steps as illustrated in FIG. 30 may be added, removed, replaced, rearranged and repeated.

At step 3002, a first semiconductor die and a first dummy die are attached to a carrier through a release layer, such as illustrated in FIGS. 2-3. The thickness of the first semiconductor die is greater than the thickness of the first dummy die. The first semiconductor die comprises a substrate portion and an interconnect portion. The backside of the substrate portion of the first semiconductor die is in direct contact with the release layer.

At step 3004, a first molding compound layer is formed over the carrier, such as illustrated in FIG. 4. The first semiconductor die and the first dummy die are embedded in the first molding compound layer. At step 3006, a first thinning process is applied to the first molding compound layer until the top surface of the first semiconductor die is exposed, such as illustrated in FIG. 5.

At step 3008, a first interconnect structure is formed over the first molding compound layer, such as illustrated in FIGS. 6-16. At step 3010, a plurality of through vias is formed over the first interconnect structure, such as illustrated in FIGS. 22-24.

At step 3012, a second semiconductor die and a second dummy die are attached to the first interconnect structure, such as illustrated in FIG. 25. The thickness of the second semiconductor die is greater than the thickness of the second dummy die. Both the second semiconductor die and the second dummy die are secured to a dielectric layer over the first interconnect structure through an adhesive layer.

At step 3014, a second molding compound layer is formed over the first molding compound layer, such as illustrated in FIG. 26. The plurality of vias, the second semiconductor die and the second dummy die are embedded in the second molding compound layer.

At step 3016, a second thinning process is applied to the second molding compound layer until the top surface of the second semiconductor die is substantially level with the top surfaces of the vias, such as illustrated in FIG. 27. At step 3018, a second interconnect structure is formed over the top surface of the second molding compound layer, such as illustrated in FIG. 28.

At step 3020, a plurality of UBM structures is formed over the second interconnect structure, such as illustrated in FIG. 28. A plurality of bumps is formed over their respective UBM structures, such as illustrated in FIG. 28. At step 3022, a suitable carrier removal technique is employed to separate the carrier from the semiconductor device, such as illustrated in FIG. 29.

Figure 31:
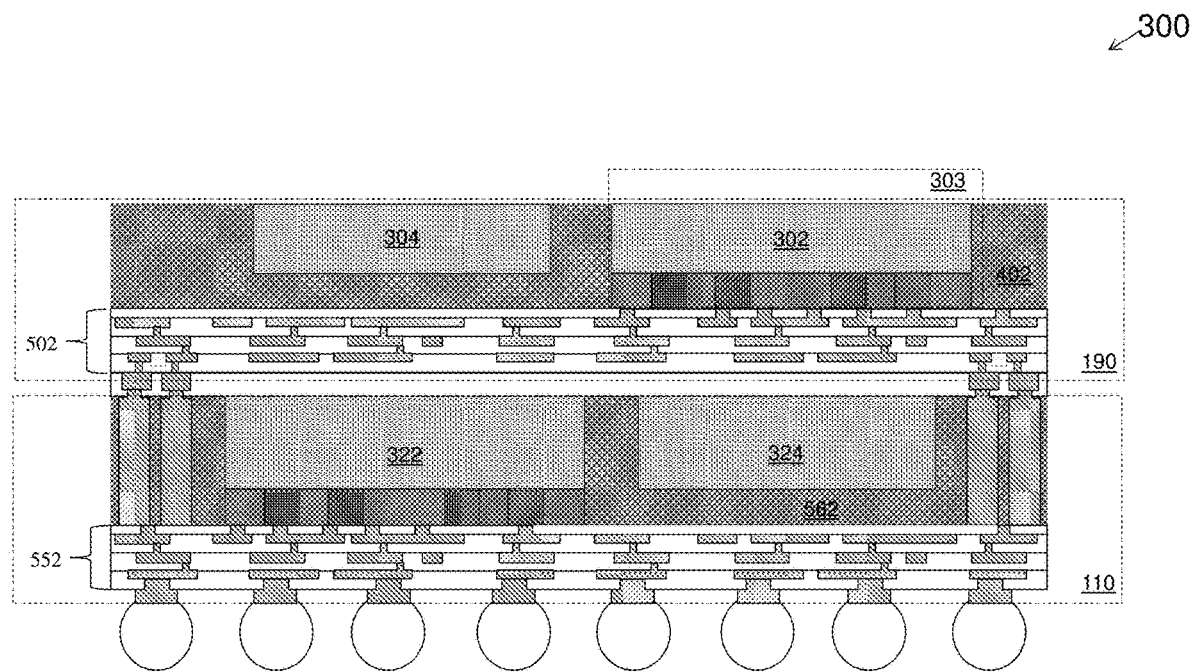
FIG. 31 illustrates a cross sectional view of another stacked-die semiconductor device in accordance with various embodiments of the present disclosure.

FIG. 31 illustrates a stacked-die semiconductor device 300 having a plurality of dummy dies. FIG. 31 illustrates structures similar to those discussed above with reference to FIG. 21, wherein like reference numerals refer to like elements, and descriptions on the like elements are not repeated.

FIG. 31 illustrates a cross sectional view of the stacked-die semiconductor device 300 in accordance with various embodiments of the present disclosure. The stacked-die semiconductor device 300 is similar to the stacked-die semiconductor device 200 shown in FIG. 21 except that the first dummy die 304 is over the second semiconductor 323, and the second dummy die 324 is underneath the first semiconductor die 303. In some embodiments, a center of the first dummy die 304 is vertically aligned with a center of the second semiconductor 323. Likewise, a center of the second dummy die 324 is vertically aligned with a center of the first semiconductor die 303.

Figure 32:
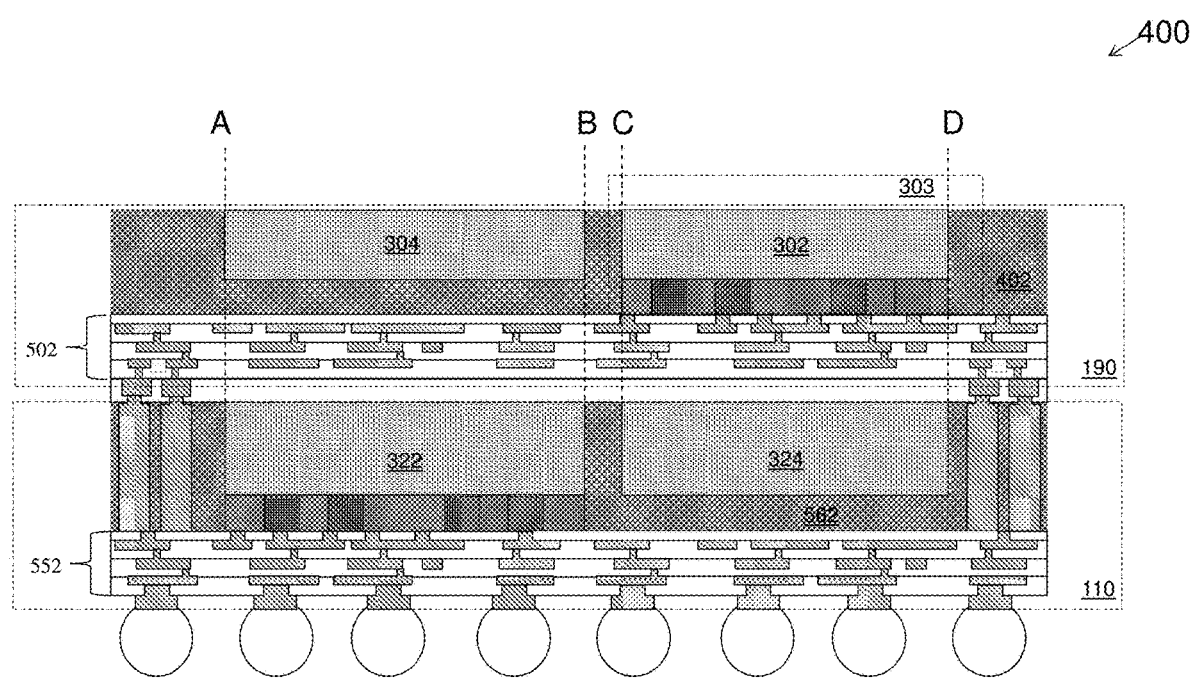
FIG. 32 illustrates a cross sectional view of yet another stacked-die semiconductor device in accordance with various embodiments of the present disclosure.

FIG. 32 illustrates another stacked-die semiconductor device 400 having a plurality of dummy dies. FIG. 32 illustrates structures similar to those discussed above with reference to FIG. 21, wherein like reference numerals refer to like elements, and descriptions on the like elements are not repeated.

FIG. 32 illustrates a cross sectional view of the stacked-die semiconductor device 400 in accordance with various embodiments of the present disclosure. The stacked-die semiconductor device 400 is similar to the stacked-die semiconductor device 300 shown in FIG. 31 except that the edges of the first dummy die 304 are vertically aligned with their respective edges of the second semiconductor 323 as indicated by the dashed lines A and B. Likewise, the edges of the second dummy die 324 are vertically aligned with their respective edges of the first semiconductor die 303 as indicated by the dashed lines C and D.

Figure 33:
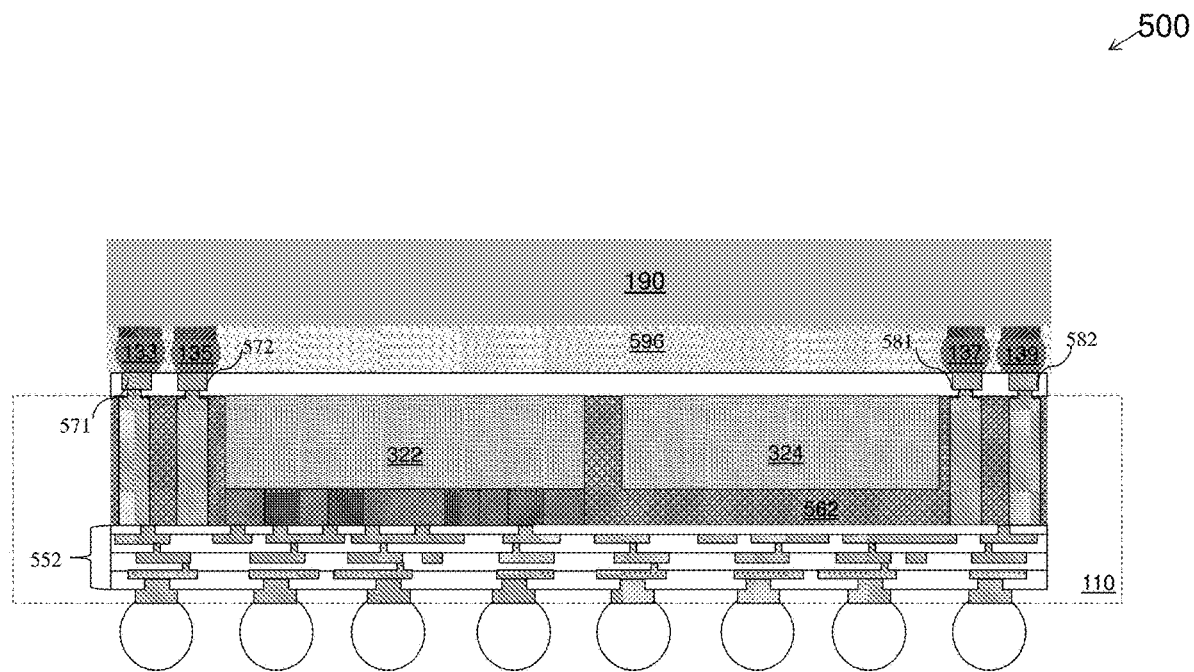
FIG. 33 illustrates a cross sectional view of a package-on-package semiconductor device in accordance with various embodiments of the present disclosure.

FIG. 33 illustrates a package-on-package semiconductor device 500 having a dummy die. FIG. 33 illustrates bottom package 110 similar to those discussed above with reference to FIG. 21, wherein like reference numerals refer to like elements, and descriptions on the like elements are not repeated.

FIG. 33 illustrates a cross sectional view of the package-on-package semiconductor device 500 in accordance with various embodiments of the present disclosure. The package-on-package semiconductor device 500 comprises a bottom package and a top package. The bottom package 110 shown in FIG. 33 is similar to the bottom package 110 shown in FIG. 21, and hence is not discussed in further detail.

The top package 190 may comprise a plurality of stacked dies (not shown), which may be wire bonded to the input and output terminals of the top package 190. The input and output terminals are bumps 133, 135, 137 and 139. In some embodiments, the bumps 133, 135, 137 and 139 are solder balls. The stacked dies of the top package 190 may comprise memory dies, logic dies, processor dies, any combinations thereof and the like. In some embodiments, the top package 190 comprises a plurality of dynamic random-access memory (DRAM) semiconductor devices.

The top package 190 may be bonded to the bottom package 110 through a reflow process. The bonding process comprises placing the solder balls 133, 135, 137 and 139 of the top package 190 against the respective pads 571, 572, 581 and 582. A reflow process is then performed to melt solder balls 133, 135, 137 and 139, thereby forming a joint structure between the top package 190 and the bottom package 110. An underfill layer 596 may be formed between the top package 190 and the bottom package 110 as shown in FIG. 33.

Figure 34:
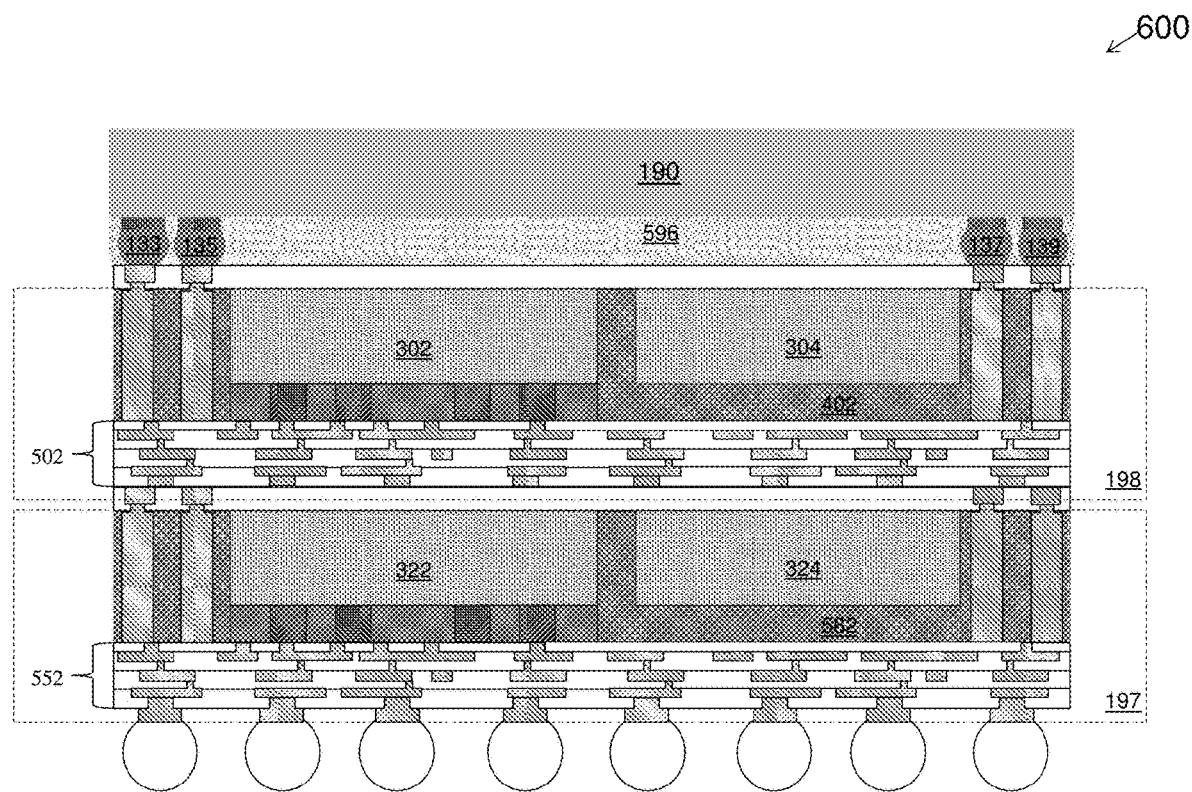
FIG. 34 illustrates a cross sectional view of another package-on-package semiconductor device in accordance with various embodiments of the present disclosure.

FIG. 34 illustrates another package-on-package semiconductor device 600 having at least a dummy die. FIG. 34 illustrates structures similar to those discussed above with reference to FIG. 21, wherein like reference numerals refer to like elements, and descriptions on the same elements are not repeated.

FIG. 34 illustrates a cross sectional view of the package-on-package semiconductor device 600 in accordance with various embodiments of the present disclosure. The package-on-package semiconductor device 600 is similar to the package-on-package semiconductor device 500 except that the bottom package is formed by two packages. A first package 197 and a second package 198 are similar to the bottom package shown in FIG. 33, and hence are not discussed in further detail to avoid repetition.

Figure 35:
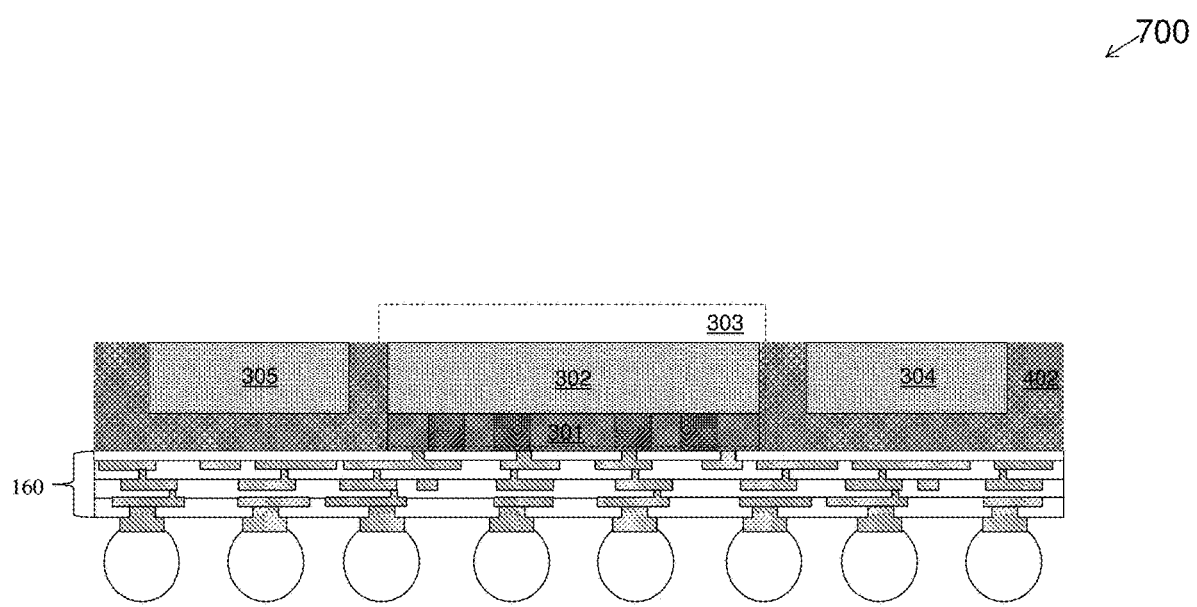
FIG. 35 illustrates a cross sectional view of another semiconductor device in accordance with various embodiments of the present disclosure.

FIG. 35 illustrates a semiconductor device 700 having a plurality of dummy dies. FIG. 35 illustrates structures similar to those discussed above with reference to FIG. 1, wherein like reference numerals refer to like elements, and descriptions on the same elements are not repeated.

FIG. 35 illustrates a cross sectional view of the semiconductor device 700 in accordance with various embodiments of the present disclosure. The semiconductor device 700 is similar to the semiconductor device 100 shown in FIG. 1 except that there may be two dummy dies, namely a first dummy die 304 and a second dummy die 305.

The thickness of the semiconductor die 303 is greater than the thicknesses of the first dummy die 304 and the second dummy die 305. As shown in FIG. 35, the first dummy die 304 and the second dummy die 305 are placed on opposite sides of the semiconductor die 303. The bottom surfaces of the first dummy die 304 and the second dummy die 305 are not in contact with the interconnect structure 160.

It should be noted that while FIG. 35 shows two dummy dies 304 and 305, the semiconductor device 700 may accommodate any number of dummy dies. For example, the semiconductor device 700 may comprises four dummy dies. The top views of the semiconductor device 700 having four dummy dies will be described below with respect to FIGS. 36-38.

Figure 36:
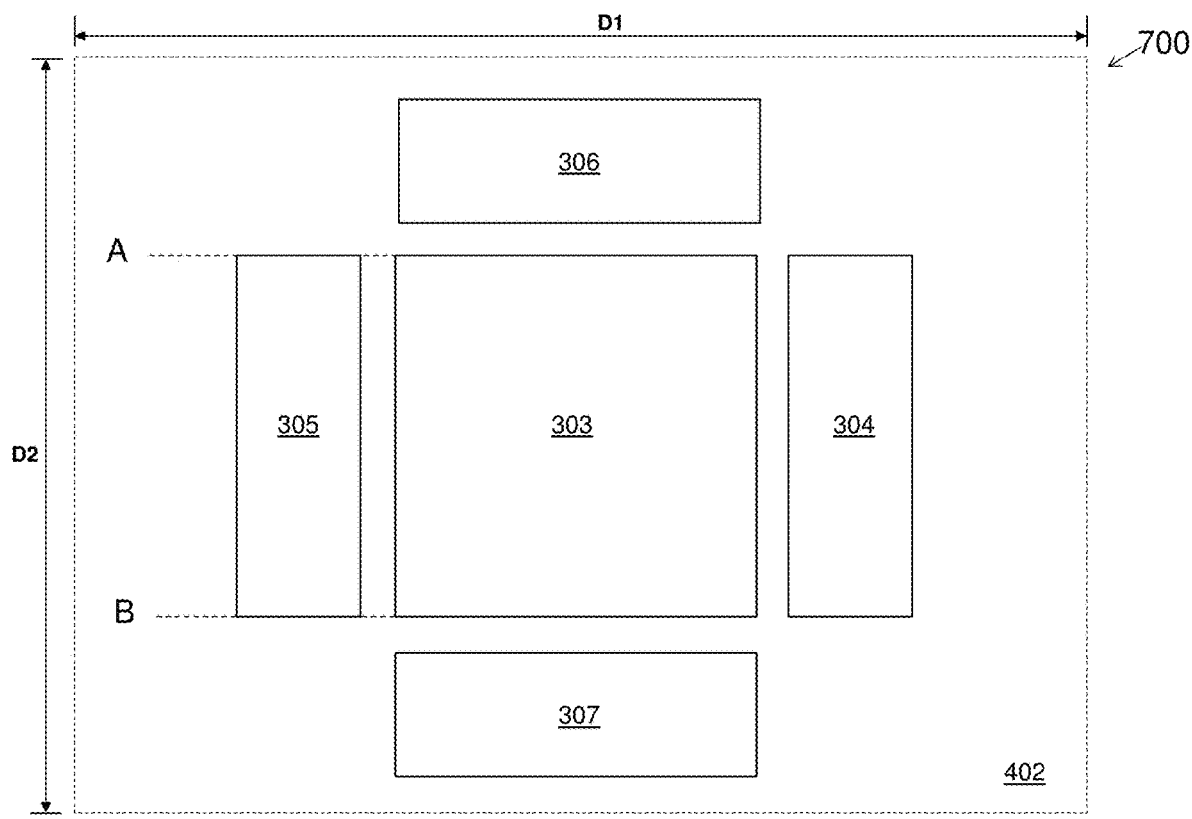
FIG. 36 illustrates a top view of the semiconductor device shown in FIG. 35 in accordance with various embodiments of the present disclosure.

FIG. 36 illustrates a top view of the semiconductor device 700 shown in FIG. 35 in accordance with various embodiments of the present disclosure. There may be four dummy dies placed adjacent to the semiconductor die 303. In particular, a first dummy die 304 is placed along a first sidewall of the semiconductor die 303. A second dummy die 305 is placed along a second sidewall of the semiconductor die 303. The first dummy die 304 and the second dummy die 305 are placed on opposite sides of the semiconductor die 303.

A third dummy die 306 is placed along a third sidewall of the semiconductor die 303. A fourth dummy die 307 is placed along a fourth sidewall of the semiconductor die 303. The third dummy die 306 and the fourth dummy die 307 are placed on opposite sides of the semiconductor die 303.

In some embodiments, the length of the dummy dies is substantially equal to the length of the corresponding side of the semiconductor die 303 as shown in FIG. 36. In addition, the edges of the dummy dies (e.g., dummy die 305) are aligned with the edges of the semiconductor die 303 as indicated by the dashed lines A and B.

Furthermore, the aspect ratio of the dummy dies (e.g., dummy die 305) is less than 10 in some embodiments. In other words, the ratio of length of the dummy die 305 to the width of the dummy die 305 is less than 10.

Additionally, the size of the dummy dies are selected such that the ratio of the area of a major surface of the package (e.g., D1 times D2) to the sum of the areas of the semiconductor die 303 and the dummy dies 304-307 in a plan view is less than 3.

Figure 37:
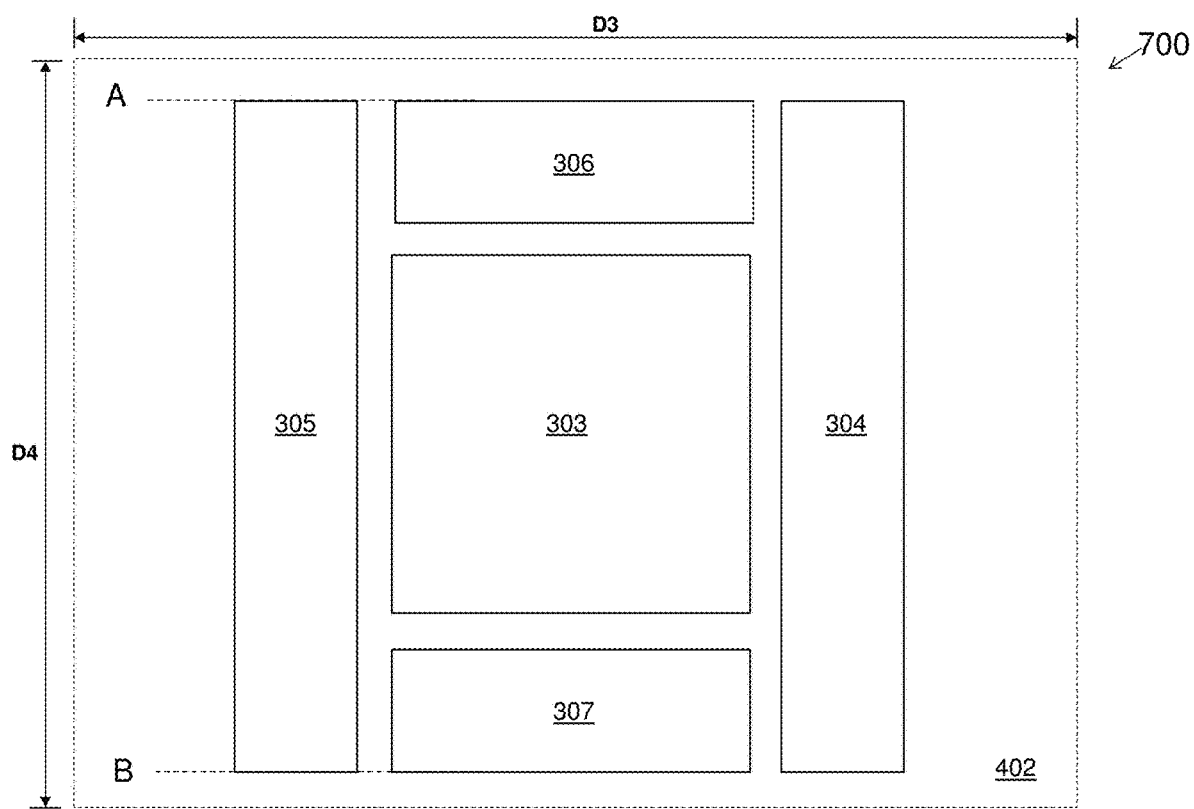
FIG. 37 illustrates another top view of the semiconductor device shown in FIG. 35 in accordance with various embodiments of the present disclosure.

FIG. 37 illustrates another top view of the semiconductor device 700 shown in FIG. 35 in accordance with various embodiments of the present disclosure. The top view shown in FIG. 37 is similar to that shown in FIG. 36 except that the lengths of two dummy dies (e.g., dummy dies 304 and 305) are greater than the length of the semiconductor die 303. In some embodiments, the edges of the dummy dies (e.g., dummy die 305) are aligned with the outer edges of the dummy dies 306 and 307 as indicated by the dashed lines A and B as shown in FIG. 29.

Additionally, the size of the dummy dies in FIG. 37 are selected such that the ratio the area of a major surface of the package (e.g., D3 times D4) to the sum of the areas of the semiconductor die 303 and the dummy dies 304-307 in a plan view is less than 3.

Figure 38:
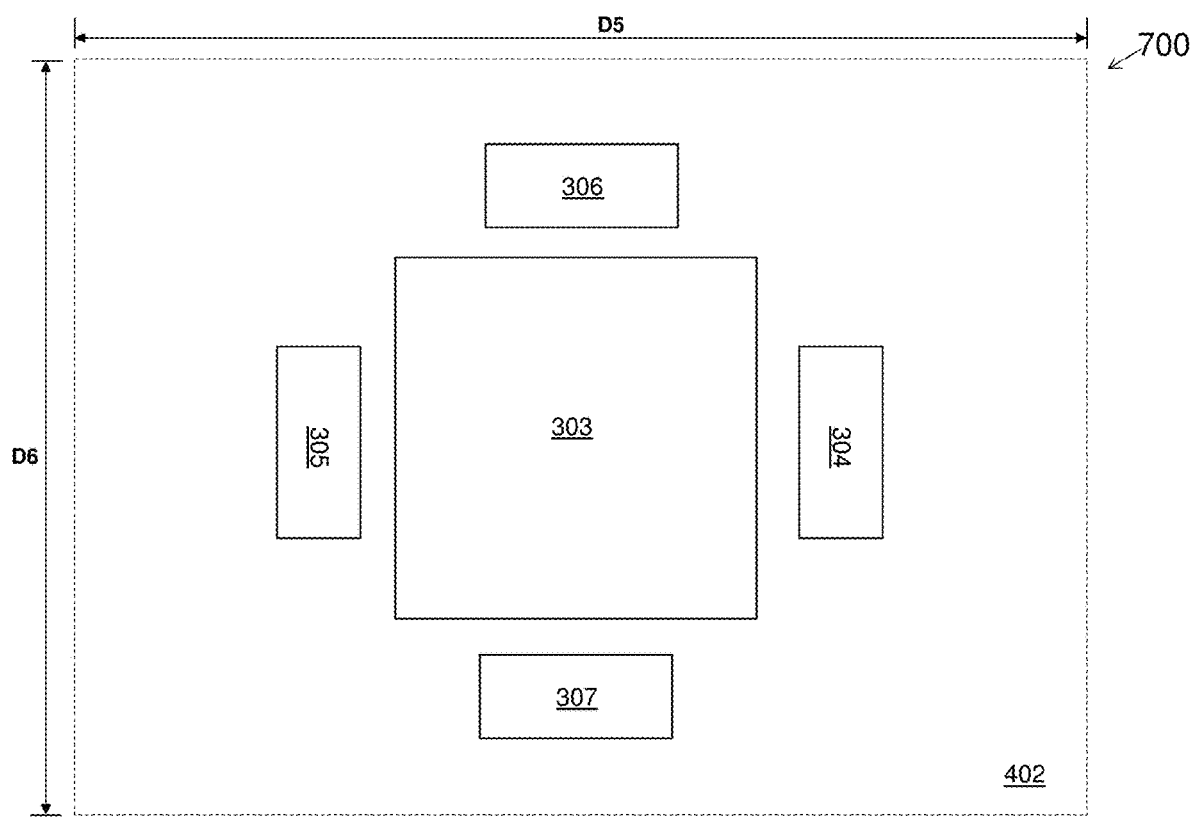
FIG. 38 illustrates another top view of the semiconductor device shown in FIG. 35 in accordance with various embodiments of the present disclosure.

FIG. 38 illustrates another top view of the semiconductor device shown in FIG. 35 in accordance with various embodiments of the present disclosure. The top view shown in FIG. 38 is similar to that shown in FIG. 36 except that the length of the corresponding sides the semiconductor die 303 is greater than the lengths of the respective dummy dies.

Additionally, the size of the dummy dies in FIG. 38 are selected such that the ratio the area of a major surface of the package (e.g., D5 times D6) to the sum of the areas of the semiconductor die 303 and the dummy dies 304-307 in a plan view is less than 3.

In accordance with an embodiment, a device comprises a first die and a first dummy die in a molding compound layer, wherein the first die comprises a substrate and an interconnect portion and a height of the first die is greater than a height of the first dummy die and an interconnect structure over the molding compound layer, wherein a metal feature of the interconnection portion of the first die is in contact with a first metal feature of the interconnect structure and a second metal feature of the interconnect structure and the first dummy die are separated by the molding compound layer, and wherein the second metal feature laterally overlaps a sidewall of the first dummy die.

In accordance with an embodiment, a device comprises a first die extending through a molding compound layer, a first dummy die having a bottom embedded in the molding compound layer, wherein a height of the first die is greater than a height of the first dummy die, and an interconnect structure over the molding compound layer, wherein a first metal feature of the interconnect structure is electrically connected to the first die and a second metal feature of the interconnect structure is over the first dummy die and extends over a sidewall of the first dummy die.

In accordance with an embodiment, an apparatus comprises a first die having a substrate portion and an interconnect portion, a first dummy die having a thickness substantially equal to a thickness of the substrate portion of the first die and an interconnect structure in contact with the interconnect portion of the first die, wherein a first metal feature of the interconnect structure is in direct contact with a metal feature of the interconnect portion of the first die and a second metal feature of the interconnect structure is over the first dummy die and extends beyond a sidewall of the first dummy die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first die and a first dummy die in a molding compound layer, wherein:
the first die comprises a substrate and an interconnect portion; and a height of the first die is greater than a height of the first dummy die; and an interconnect structure over the molding compound layer, wherein:
a metal feature of the interconnect portion of the first die is in contact with a first metal feature of the interconnect structure; and
a second metal feature of the interconnect structure and the first dummy die are separated by the molding compound layer, and wherein the second metal feature laterally overlaps a sidewall of the first dummy die.

2. The device of claim 1, wherein:
the first die is a semiconductor die comprising a plurality of active circuits; and
the first dummy die is free of any active circuits.

3. The device of claim 1, wherein:
a height of the substrate is substantially equal to the height of the first dummy die.

4. The device of claim 1, wherein:
the first metal feature of the interconnect structure is a metal line.

5. The device of claim 4, wherein:
the metal line is in direct contact with a first terminal of a via; and
a second terminal of the via is in direct contact with the metal feature of the interconnect portion of the first die.

6. The device of claim 1, further comprising:
a length of the first die is substantially equal to a length of the first dummy die.

7. The device of claim 1, wherein:
a top surface of the first metal feature of the interconnect structure is level with a top surface of the second metal feature of the interconnect structure.

8. The device of claim 1, wherein:
the metal feature of the interconnect portion of the first die is a contact pad.

9. The device of claim 1, further comprising:
a plurality of bumps over the interconnect structure.

10. The device of claim 1, wherein:
a first side of the first die is exposed outside the molding compound layer; and
a second side of the first die in direct contact with the interconnect structure.

11. A device comprising:
a first die extending through a molding compound layer;
a first dummy die having a bottom embedded in the molding compound layer, wherein a height of the first die is greater than a height of the first dummy die; and
an interconnect structure over the molding compound layer, wherein:
a first metal feature of the interconnect structure is electrically connected to the first die; and
a second metal feature of the interconnect structure is over the first dummy die and extends over a sidewall of the first dummy die.

12. The device of claim 11, further comprising:
a first dielectric layer on and in direct contact with the molding compound layer.

13. The device of claim 12, wherein:
a via is in the first dielectric layer, and wherein the first metal feature of the interconnect structure is electrically connected to the first die through the via.

14. The device of claim 12, further comprising:
a second dielectric layer on and in direct contact with the first dielectric layer.

15. The device of claim 14, wherein:
the first metal feature and the second metal feature are in the second dielectric layer.

16. An apparatus comprising:
a first die having a substrate portion and an interconnect portion;
a first dummy die having a thickness substantially equal to a thickness of the substrate portion of the first die; and
an interconnect structure in contact with the interconnect portion of the first die, wherein:
a first metal feature of the interconnect structure is in direct contact with a metal feature of the interconnect portion of the first die; and
a second metal feature of the interconnect structure is over the first dummy die and extends beyond a sidewall of the first dummy die.

17. The apparatus of claim 16, further comprising:
a molding compound layer, wherein the first die and the first dummy die are in the molding compound layer.

18. The apparatus of claim 17, further comprising:
a dielectric layer on and in direct contact with the molding compound layer.

19. The apparatus of claim 18, wherein:
the first metal feature comprises a metal line portion and a via portion, and wherein the via portion extends through the dielectric layer.

20. The apparatus of claim 18, wherein:
the dielectric layer comprises a first portion over the first die and a second portion over the first dummy die, and wherein the second portion of the dielectric layer is free of conductive elements.

* * * * *